(12) United States Patent
Cook et al.

(10) Patent No.: US 10,811,334 B2
(45) Date of Patent: Oct. 20, 2020

(54) INTEGRATED CIRCUIT NANOPARTICLE THERMAL ROUTING STRUCTURE IN INTERCONNECT REGION

(71) Applicant: Texas Instruments Incorporated, Dallas, TX (US)

(72) Inventors: Benjamin Stassen Cook, Rockwall, TX (US); Archana Venugopal, Dallas, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/361,394

(22) Filed: Nov. 26, 2016

(65) Prior Publication Data
US 2018/0151470 A1    May 31, 2018

(51) Int. Cl.
*H01L 23/48*     (2006.01)
*H01L 23/52*     (2006.01)
(Continued)

(52) U.S. Cl.
CPC ...... *H01L 23/3677* (2013.01); *H01L 21/4882* (2013.01); *H01L 21/76801* (2013.01);
(Continued)

(58) Field of Classification Search
CPC ........... H01L 21/4882; H01L 21/76801; H01L 21/76877; H01L 23/3733; H01L 23/522;
(Continued)

(56) References Cited

U.S. PATENT DOCUMENTS

| 5,224,030 A | 6/1993 | Banks et al. |
| 5,481,136 A | 1/1996 | Kohmoto et al. |

(Continued)

FOREIGN PATENT DOCUMENTS

| CN | 105419345 | 3/2016 |
| EP | 2388810 A2 | 11/2011 |

(Continued)

OTHER PUBLICATIONS

Awano et al., Carbon Nanotubes for VLSI: Interconnect and Transistor Applications—2010, Proceedings of the IEEE, vol. 98, No. 12, pp. 2015-2031.

(Continued)

*Primary Examiner* — Duy T Nguyen
*Assistant Examiner* — Dilinh P Nguyen
(74) *Attorney, Agent, or Firm* — Ebby Abraham; Charles A. Brill; Frank D. Cimino

(57) ABSTRACT

An integrated circuit has a substrate and an interconnect region disposed on the substrate. The interconnect region has a plurality of interconnect levels. The integrated circuit includes a thermal routing structure in the interconnect region. The thermal routing structure extends over a portion, but not all, of the integrated circuit in the interconnect region. The thermal routing structure includes a cohered nanoparticle film in which adjacent nanoparticles cohere to each other. The thermal routing structure has a thermal conductivity higher than dielectric material touching the thermal routing structure. The cohered nanoparticle film is formed by a method which includes an additive process.

13 Claims, 17 Drawing Sheets

FIG. 1B

(51) Int. Cl.
*H01L 29/40* (2006.01)
*H01L 23/495* (2006.01)
*H01L 23/34* (2006.01)
*H01L 23/367* (2006.01)
*H01L 23/373* (2006.01)
*H01L 21/48* (2006.01)
*H01L 21/768* (2006.01)
*H01L 23/522* (2006.01)
*H01L 23/00* (2006.01)
H01L 23/532 (2006.01)

(52) U.S. Cl.
CPC .... *H01L 21/76877* (2013.01); *H01L 23/3731* (2013.01); *H01L 23/3733* (2013.01); *H01L 23/3736* (2013.01); *H01L 23/5226* (2013.01); *H01L 24/05* (2013.01); *H01L 24/06* (2013.01); H01L 21/76829 (2013.01); H01L 23/53295 (2013.01); H01L 2224/13025 (2013.01); H01L 2224/14519 (2013.01)

(58) Field of Classification Search
CPC ..... H01L 23/5226; H01L 24/05; H01L 24/06; H01L 21/32051; H01L 21/32055; H01L 21/324; H01L 21/76895; H01L 23/3735; H01L 23/481; H01L 23/528; H01L 23/53276; H01L 23/10; H01L 23/34; H01L 23/36; H01L 23/4012; H01L 23/49586; H01L 2023/4018; H01L 2023/4025; H01L 2023/4034
USPC .......................................... 257/758, 713, 675
See application file for complete search history.

(56) References Cited

U.S. PATENT DOCUMENTS

| | | |
|---|---|---|
| 5,683,939 A | 11/1997 | Schrantz et al. |
| 6,046,503 A | 4/2000 | Weigand et al. |
| 6,100,199 A | 8/2000 | Joshi et al. |
| 6,242,807 B1 | 6/2001 | Kazami |
| 6,265,771 B1 | 7/2001 | Ference et al. |
| 6,288,426 B1 | 9/2001 | Gauthier, Jr. et al. |
| 6,646,340 B2 | 11/2003 | Deeter et al. |
| 6,771,502 B2 | 8/2004 | Getz, Jr. et al. |
| 6,773,952 B2 | 8/2004 | Armbrust et al. |
| 6,800,886 B2 | 10/2004 | Awano |
| 7,071,603 B2 | 7/2006 | Ha et al. |
| 7,161,239 B2 | 1/2007 | Zhao et al. |
| 7,189,778 B2 | 3/2007 | Tobita |
| 7,260,939 B2 | 8/2007 | Weaver, Jr. |
| 7,264,869 B2 | 9/2007 | Tobita |
| 7,286,359 B2 | 10/2007 | Khbeis et al. |
| 7,312,531 B2 | 12/2007 | Chang et al. |
| 7,345,364 B2 | 3/2008 | Kerr et al. |
| 7,473,633 B2 | 1/2009 | Furukawa et al. |
| 7,560,310 B2 | 7/2009 | Hsu |
| 7,572,680 B2 | 8/2009 | Hess et al. |
| 7,582,962 B1 | 9/2009 | Pavio |
| 7,586,191 B2 | 9/2009 | Hall et al. |
| 7,633,152 B2 | 12/2009 | Lee et al. |
| 7,642,641 B2 | 1/2010 | Mahler et al. |
| 7,763,973 B1 | 7/2010 | Bratkovski |
| 7,773,973 B2 | 7/2010 | Bratkovski et al. |
| 7,768,121 B2 | 8/2010 | Colgan et al. |
| 7,772,692 B2 | 8/2010 | Takamatsu et al. |
| 7,825,498 B2 | 11/2010 | Haga et al. |
| 7,859,087 B2 | 12/2010 | Murata et al. |
| 7,989,349 B2 | 8/2011 | Sandhu et al. |
| 8,022,532 B2 | 9/2011 | Kasuya et al. |
| 8,106,497 B2 | 1/2012 | Brunnbauer |
| 8,130,500 B2 | 3/2012 | Oda |
| 8,134,231 B2 | 3/2012 | Sano et al. |
| 8,148,820 B2 | 4/2012 | Sato |
| 8,248,803 B2 | 8/2012 | Lin et al. |
| 8,277,613 B2 | 10/2012 | Smith |
| 8,410,474 B2 | 4/2013 | Okai et al. |
| 8,440,999 B2 | 5/2013 | Dimitrakopoulos et al. |
| 8,462,511 B2 | 6/2013 | Lee |
| 8,466,054 B2 | 6/2013 | Stuber et al. |
| 8,470,701 B2 | 6/2013 | Rogers et al. |
| 8,486,824 B2 | 7/2013 | Tee et al. |
| 8,524,539 B2 | 9/2013 | Lee et al. |
| 8,535,758 B2 | 9/2013 | Bulovic |
| 8,552,554 B2 | 10/2013 | Tain et al. |
| 8,558,372 B2 | 10/2013 | Negoro |
| 8,587,064 B2 | 11/2013 | Warabino |
| 8,637,388 B2 | 1/2014 | Abou-Khalil et al. |
| 8,664,759 B2 | 3/2014 | Ryan |
| 8,836,110 B2 | 9/2014 | Chopin et al. |
| 8,865,577 B2 | 10/2014 | Wei |
| 8,866,276 B2 | 10/2014 | Su et al. |
| 8,866,294 B2 | 10/2014 | Pagaila et al. |
| 8,901,613 B2 | 12/2014 | Sekar |
| 8,937,376 B2 | 1/2015 | Tsai |
| 8,940,628 B2 | 1/2015 | Yamazaki et al. |
| 9,013,035 B2 | 4/2015 | Zhao et al. |
| 9,093,428 B2 | 7/2015 | Liang |
| 9,099,375 B2 | 8/2015 | Kub et al. |
| 9,165,721 B2 | 10/2015 | Lee et al. |
| 9,171,779 B2 | 10/2015 | Lin et al. |
| 9,245,813 B2 | 1/2016 | Bartley et al. |
| 9,308,731 B2 | 4/2016 | Williams |
| 9,331,283 B2 | 5/2016 | Lim et al. |
| 9,349,838 B2 | 5/2016 | Cheng et al. |
| 9,349,975 B2 | 5/2016 | Coe-sullivan et al. |
| 9,362,198 B2 | 6/2016 | Viswanathan |
| 9,397,023 B2 | 7/2016 | Venugopal et al. |
| 9,401,315 B1 | 7/2016 | Bodenweber |
| 2001/0035578 A1 | 11/2001 | Liang et al. |
| 2003/0064017 A1 | 4/2003 | Tobita et al. |
| 2003/0122215 A1 | 7/2003 | Wilson |
| 2004/0102597 A1 | 5/2004 | Tobita et al. |
| 2005/0079120 A1 | 4/2005 | Fujita et al. |
| 2005/0133863 A1 | 6/2005 | Werner et al. |
| 2006/0121710 A1 | 6/2006 | Liang et al. |
| 2006/0289988 A1 | 12/2006 | Rayn |
| 2007/0001292 A1 | 1/2007 | Ohta et al. |
| 2007/0126116 A1 | 6/2007 | Dangelo et al. |
| 2008/0047484 A1 | 2/2008 | Sung |
| 2008/0131352 A1 | 6/2008 | Kondo |
| 2008/0266787 A1 | 10/2008 | Gosset et al. |
| 2009/0162954 A1 | 6/2009 | Griffin et al. |
| 2009/0218682 A1 | 9/2009 | Lundberg |
| 2009/0273068 A1 | 11/2009 | Kaskoun et al. |
| 2010/0140790 A1 | 6/2010 | Setiadi et al. |
| 2010/0148357 A1 | 6/2010 | Yang et al. |
| 2010/0207277 A1* | 8/2010 | Bauer ............... H01L 24/24 257/777 |
| 2011/0039357 A1 | 2/2011 | Lin et al. |
| 2011/0140232 A1 | 6/2011 | Gaul et al. |
| 2011/0260303 A1 | 10/2011 | Pagaila et al. |
| 2011/0272824 A1 | 11/2011 | Pagaila |
| 2012/0025269 A1 | 2/2012 | Parkhurst et al. |
| 2012/0042922 A1 | 2/2012 | Kondo et al. |
| 2012/0086132 A1 | 4/2012 | Kim |
| 2012/0141678 A1 | 6/2012 | Sumerel |
| 2013/0127037 A1 | 5/2013 | Mori et al. |
| 2013/0160701 A1 | 6/2013 | Arnold et al. |
| 2014/0008756 A1 | 1/2014 | Pei et al. |
| 2014/0014975 A1 | 1/2014 | Bae et al. |
| 2014/0015158 A1 | 1/2014 | Cola |
| 2014/0057393 A1 | 2/2014 | Bonart |
| 2014/0106508 A1 | 4/2014 | Sutardja et al. |
| 2014/0131860 A1 | 5/2014 | Kanda et al. |
| 2014/0321026 A1 | 10/2014 | Hermann et al. |
| 2014/0321093 A1 | 10/2014 | Pande et al. |
| 2015/0008525 A1 | 1/2015 | Fukuzaki et al. |
| 2015/0084103 A1 | 3/2015 | Okazaki et al. |
| 2015/0129190 A1 | 5/2015 | Lin |
| 2015/0136357 A1 | 5/2015 | Johnson |
| 2015/0137307 A1 | 5/2015 | Stuber |
| 2015/0152239 A1 | 6/2015 | Guilera Grandes et al. |

(56) References Cited

U.S. PATENT DOCUMENTS

| | | |
|---|---|---|
| 2015/0159969 A1 | 6/2015 | Lu et al. |
| 2015/0162346 A1 | 6/2015 | Choi et al. |
| 2015/0166921 A1 | 6/2015 | Erdemir et al. |
| 2015/0187678 A1 | 7/2015 | Park et al. |
| 2015/0218694 A1 | 8/2015 | Xu et al. |
| 2015/0228628 A1 | 8/2015 | Pagaila |
| 2015/0237762 A1 | 8/2015 | Holt et al. |
| 2015/0255451 A1 | 9/2015 | Yasusaka |
| 2015/0270356 A1 | 9/2015 | Palacios et al. |
| 2015/0315442 A1* | 11/2015 | Hofius ............... C09K 3/1427 51/308 |
| 2015/0325524 A1 | 11/2015 | Wada et al. |
| 2015/0325531 A1 | 11/2015 | Dyer et al. |
| 2015/0348865 A1 | 12/2015 | Vincent et al. |
| 2016/0027717 A1 | 1/2016 | Jiang et al. |
| 2016/0152794 A1* | 6/2016 | Diaham ............... C08K 3/38 428/220 |
| 2016/0197027 A1 | 7/2016 | Nasser-faili |
| 2016/0215172 A1 | 7/2016 | Morita et al. |
| 2016/0291256 A1 | 10/2016 | Rollinger |
| 2016/0379960 A1* | 12/2016 | Huang ............... H01L 25/0657 257/432 |
| 2016/0380090 A1 | 12/2016 | Roberts et al. |
| 2017/0338214 A1* | 11/2017 | Uzoh ............... H01L 21/304 |

FOREIGN PATENT DOCUMENTS

| | | |
|---|---|---|
| JP | 2002088257 | 3/2002 |
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Sato et al., "Growth of diameter-controlled carbon nanotubes using monodisperse nickel nanoparticles obtained with a differential mobility analyzer"—2003, Chemical Phys. Lett. 382 (2003) 361-366.

Sabine Szunerits, et al.; "Diamond Nanowires: A Novel Platform for Electrochemistry and Matrix-Free Mass Spectrometry"; Sensors; ISSN 1424-8220; www.mdpi.com/journal/sensors; Apr. 19, 2015; Published: May 27, 2015; pp. 12573-12593.

International Search Report for PCT/US2017/063136 dated Apr. 5, 2018.

International Search Report for PCT/US2017/063131 dated Apr. 19, 2018.

Extended European Search Report for 17874089.0; dated Nov. 25, 2019; 9 pages.

Extended European Search Report for 17874052.8; dated Nov. 25, 2019; 9 pages.

* cited by examiner

INTEGRATED CIRCUIT NANOPARTICLE THERMAL ROUTING STRUCTURE IN INTERCONNECT REGION

FIELD OF THE INVENTION

This disclosure relates to the field of integrated circuits. More particularly, this disclosure relates to thermal management in integrated circuits.

BACKGROUND OF THE INVENTION

Integrated circuits frequently generate undesired heat in some active components. It is sometimes desired to remove the heat through a heat sink or other passive structure. It is sometimes desired to divert the heat from thermally sensitive components in the integrated circuit. Managing excess heat in integrated circuits has become increasingly problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit has a substrate and an interconnect region disposed on the substrate. The interconnect region has a plurality of interconnect levels. The integrated circuit includes a thermal routing structure in the interconnect region. The thermal routing structure extends over a portion, but not all, of the integrated circuit in the interconnect region. The thermal routing structure includes a cohered nanoparticle film in which adjacent nanoparticles cohere to each other. The thermal routing structure has a thermal conductivity higher than dielectric material touching the thermal routing structure. The cohered nanoparticle film is formed by a method which includes an additive process.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent applications are related and hereby incorporated by reference: U.S. patent application Ser. No. 15/361,390, U.S. patent application Ser. No. 15/361,397, U.S. patent application Ser. No. 15/361,399, U.S. patent application Ser. No. 15/361,401, U.S. patent application Ser. No. 15/361,403, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

Figure 1A:
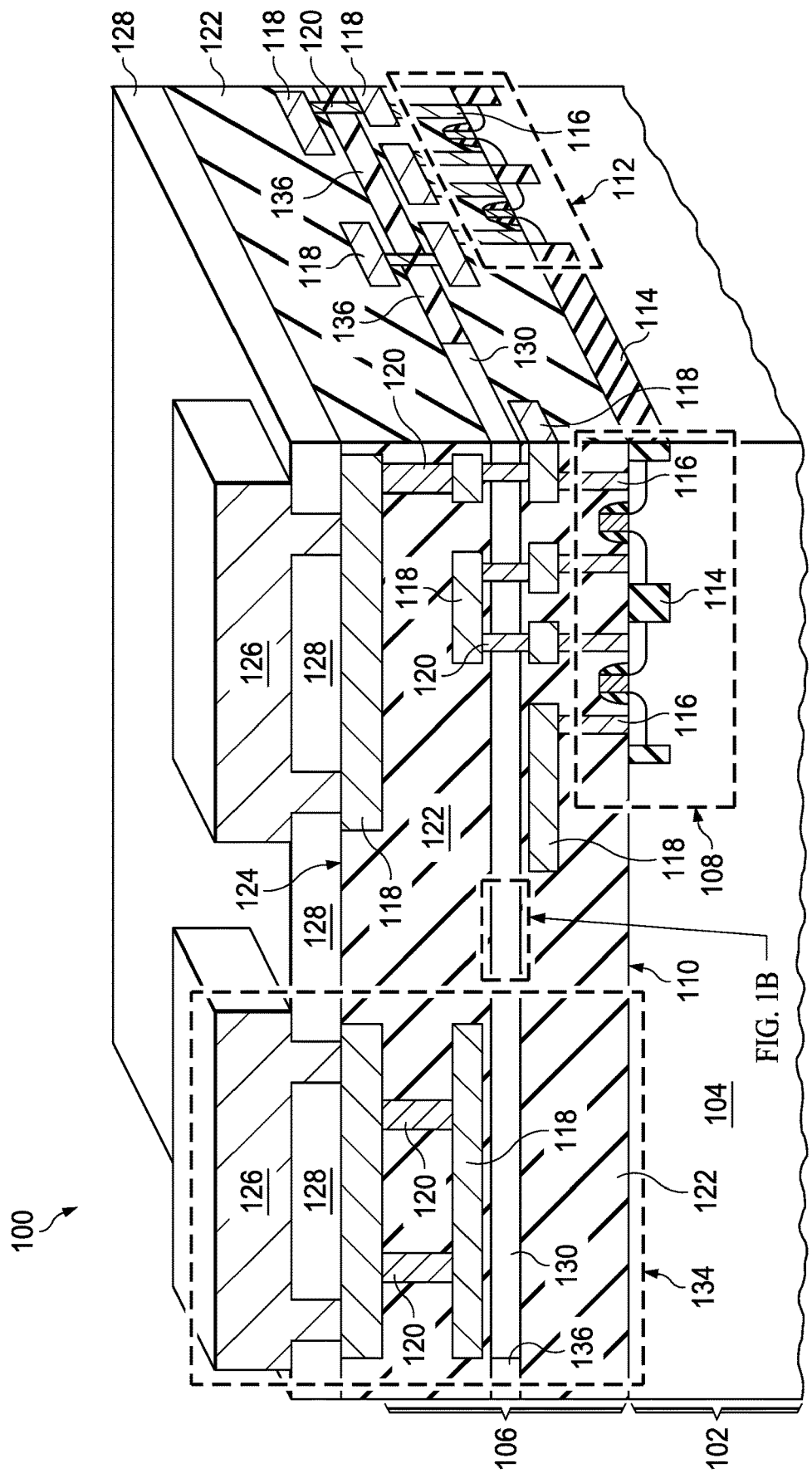
FIG. 1A and FIG. 1B are cross sections of an example integrated circuit containing a thermal routing structure according to an embodiment of the invention.
Figure 1B:
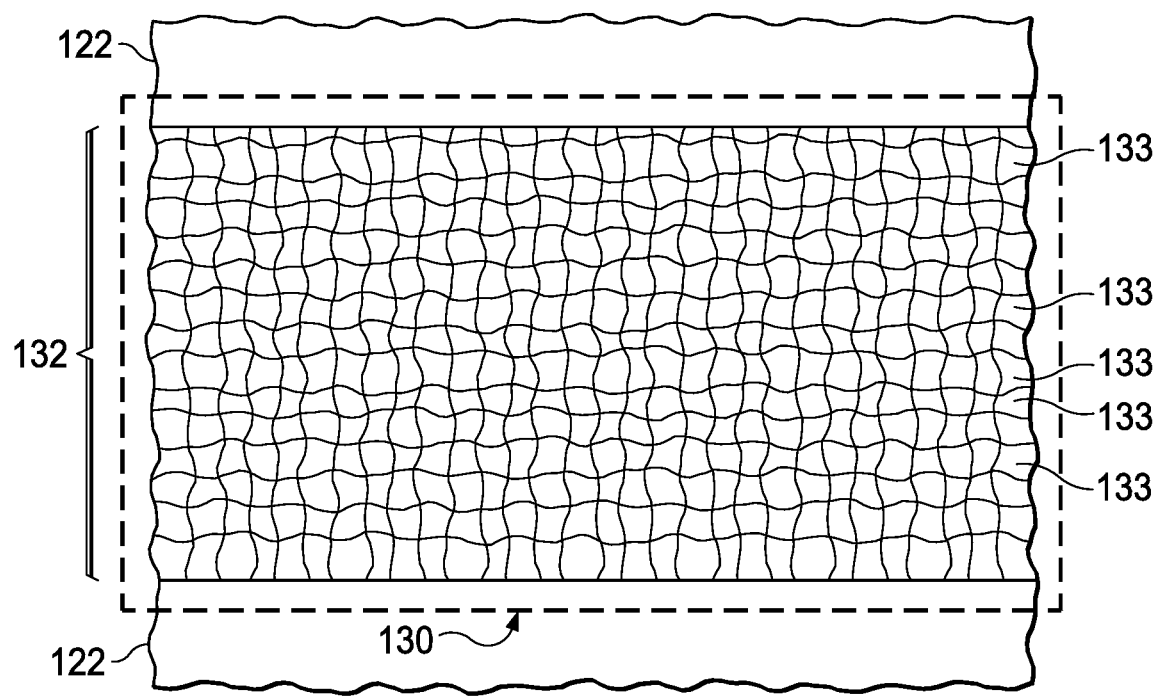

FIG. 1A and FIG. 1B are cross sections of an example integrated circuit containing a thermal routing structure according to an embodiment of the invention. Referring to FIG. 1A, the integrated circuit 100 includes a substrate 102 including a semiconductor material 104 such as silicon, silicon germanium or silicon carbide. Alternatively, the semiconductor material 104 may be a type III-V semiconductor such as gallium nitride or gallium arsenide. Other semiconductor materials are within the scope of the instant example. The integrated circuit 100 further includes an interconnect region 106 disposed above the substrate 102. Heat-generating components 108 of the integrated circuit 100, depicted in FIG. 1A as metal oxide semiconductor (MOS) transistors, are disposed in the substrate 102, possibly extending into the interconnect region 106, proximate to a boundary 110 between the substrate 102 and the interconnect region 106. Other manifestations of the heat-generating components 108, such as bipolar junction transistors, junction field effect transistors (JFETs), resistors, and silicon controlled rectifiers (SCRs) are within the scope of the instant example. In the instant example, the integrated circuit 100 may also include thermally sensitive components 112, depicted in FIG. 1A as MOS transistors. Other manifestations of the thermally sensitive components 112 are within the scope of the instant example. The components 108 and 112 may be laterally separated by field oxide 114 at the boundary 110 between the substrate 102 and the interconnect region 106. The field oxide 114 may have, for example, a shallow trench isolation (STI) structure as depicted in FIG. 1A, or may have a localized oxidation of silicon (LOCOS) structure.

The interconnect region 106 may include contacts 116, interconnects 118 and vias 120 disposed in a dielectric layer stack 122. The contacts 116 make electrical connections to the heat-generating components 108 and the thermally sensitive components 112. The interconnects 118 are disposed in a plurality of interconnect levels. The interconnects 118 in a first interconnect level make electrical connections to the contacts 116. The vias 120 are disposed between successive interconnect levels and make electrical connections to the interconnects. A top surface 124 of the interconnect region 106 is located at a surface of the interconnect region 106 opposite to the boundary 110 between the substrate 102 and the interconnect region 106. The interconnects 118 may include aluminum interconnects, damascene copper interconnects, and/or plated copper interconnects. An aluminum interconnect may include an aluminum layer with a few percent silicon, titanium, and/or copper, possibly on an adhesion layer including titanium, and possibly with an anti-reflection layer of titanium nitride on the aluminum layer. A damascene copper interconnect may include copper on a barrier layer of tantalum and/or tantalum nitride, disposed in a trench in the dielectric layer stack 122. A plated copper interconnect may include an adhesion layer at a bottom of the interconnect, and may have a barrier layer disposed on the sides of the interconnect. Bond pad structures 126 may be disposed over the top surface 124 of the interconnect region 106, and may be electrically coupled to the interconnects 118. A protective overcoat 128 may be disposed over the top surface 124 of the interconnect region 106. The protective overcoat 128 may include one or more layers of dielectric material, such as silicon dioxide, silicon nitride, silicon oxide nitride, and/or polyimide.

A thermal routing structure 130 is disposed in the interconnect region 106, extending over a portion, but not all, of the integrated circuit 100 in the interconnect region 106. The thermal routing structure 130 has a higher thermal conductivity than dielectric material in the interconnect region 106 that touches the thermal routing structure 130. Thermal conductivity may be understood as a property of a material, and may be expressed in units of watts/meter ° C. The thermal routing structure 130 includes a cohered nanoparticle film 132 including primarily nanoparticles 133, shown in more detail in FIG. 1B. Adjacent nanoparticles 133 cohere to each other. There may be inorganic functional molecules, for example silane-based molecules including silicon and oxygen, on surfaces of the nanoparticles 133. The thermal routing structure 130 is substantially free of an organic binder material such as adhesive or polymer. The thermal routing structure 130 may extend from an area over the heat-generating components 108 to a heat removal region 134 of the integrated circuit 100, as shown in FIG. 1A. The thermal routing structure 130 may be located outside an area over the thermally sensitive components 112, as shown in FIG. 1A, thus configured to advantageously divert heat from the heat-generating components 108 away from the thermally sensitive components 112 during operation of the integrated circuit 100.

In a version of the instant example as depicted in FIG. 1A and FIG. 1B, thermal routing structure 130 may be electrically non-conductive, and the nanoparticles 133 may include, for example, aluminum oxide, diamond, hexagonal boron nitride, cubic boron nitride, and/or aluminum nitride. The thermal routing structure 130 may touch the contacts 116, the interconnects 118, and/or the vias 120 without risking undesired electrical shunts, enabling more complete coverage of the area over the heat-generating components 108 and in the heat removal region 134, to advantageously collect more heat from the heat-generating components 108, and more efficiently deliver the heat to the heat removal region 134.

In another version of the instant example, the thermal routing structure 130 may be electrically conductive. In such a version, the nanoparticles 133 may include nanoparticles of, for example, metal, graphene, graphene embedded in metal, graphite, graphitic carbon, and/or carbon nanotubes. Electrically conductive versions of the thermal routing structure 130 may be separated from the contacts 116, the interconnects 118, and the vias 120.

In a further version of the instant example, the nanoparticles 133 may include nanoparticles which include metal, and the thermal routing structure 130 may include a layer of graphitic material on the cohered nanoparticle film 132. In such a version, the nanoparticles 133 may include, for example, copper, nickel, palladium, platinum, iridium, rhodium, cerium, osmium, molybdenum, and/or gold. In such a version, the thermal routing structure 130 is electrically conductive, and hence may be separated from the contacts 116, the interconnects 118, and the vias 120.

An optional planarization layer 136 may be disposed laterally adjacent to the thermal routing structure 130 to provide a substantially level surface for subsequent layers of the dielectric layer stack 122 and subsequent interconnect levels. The planarization layer 136 may have a thickness comparable to a thickness of the thermal routing structure 130. The planarization layer 136 may have a thermal conductivity comparable to a thermal conductivity of the dielectric layer stack 122, which is significantly less than the thermal conductivity of the thermal routing structure 130. The planarization layer 136 may include dielectric materials such as silicon dioxide and may have a granular structure.

Figure 2A:
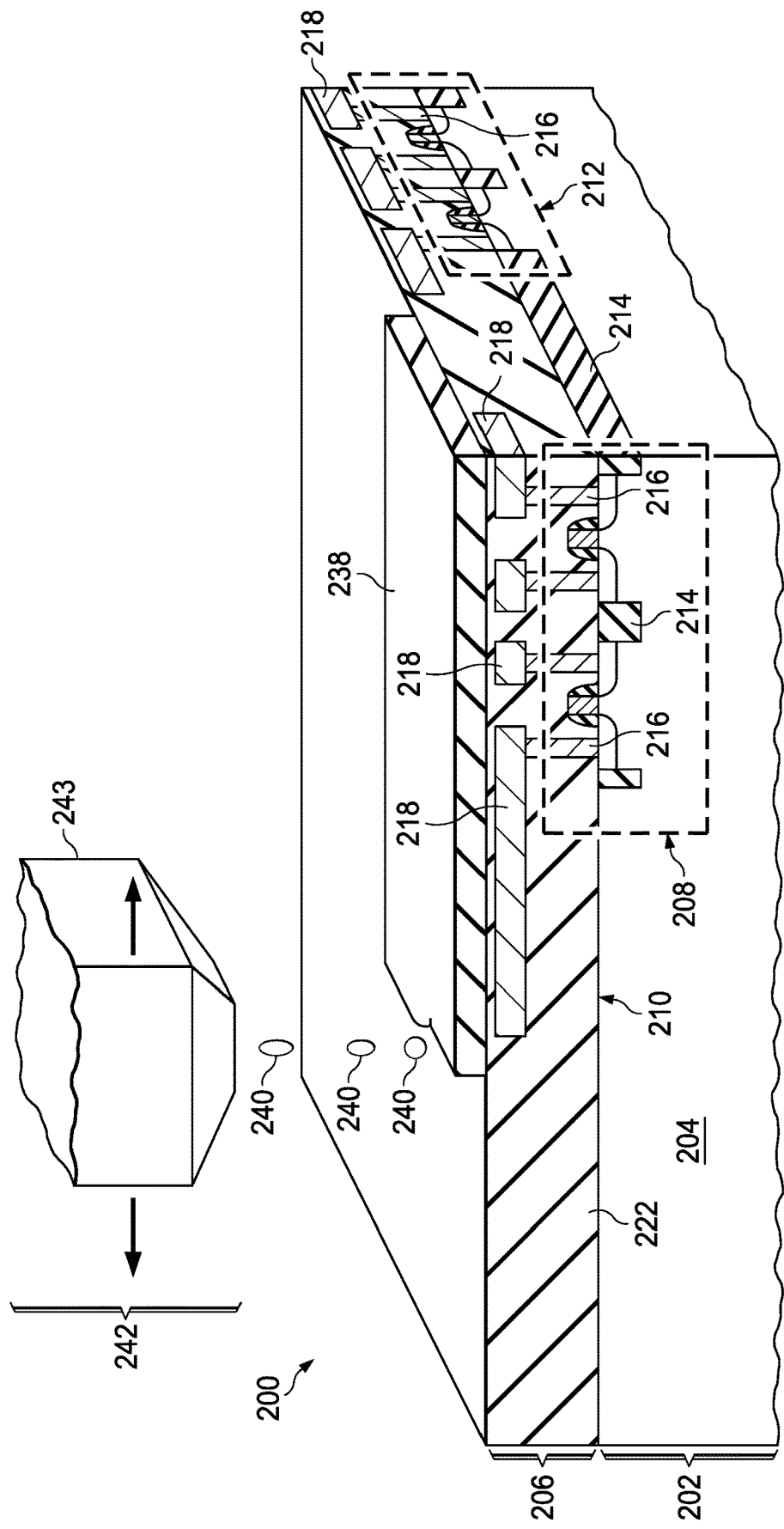
FIG. 2A through FIG. 2F depict an example method of forming an integrated circuit with a thermal routing structure according to an embodiment of the invention.

FIG. 2A through FIG. 2F depict an example method of forming an integrated circuit with a thermal routing structure according to an embodiment of the invention. Referring to FIG. 2A, the integrated circuit 200 is formed on a substrate 202 which includes a semiconductor material 204. The substrate 202 may be, for example a semiconductor wafer. The semiconductor material 204 may be a type IV semiconductor such as silicon, silicon germanium or silicon carbide. Alternatively, the semiconductor material 204 may be a type III-V semiconductor such as gallium nitride or gallium arsenide. Other semiconductor materials are within the scope of the instant example.

Components are formed in the semiconductor material 204, including heat-generating components 208 and, for example, thermally sensitive components 212. The components may include MOS transistors, bipolar junction transistors, JFETs, resistors, SCRs, diodes and/or other components. Field oxide 214 may be formed in the substrate 202 to laterally separate the components. The field oxide 214 may be formed by an STI process or alternatively by a LOCOS process.

An interconnect region 206 is formed over the substrate 202. FIG. 2A shows the interconnect region 206 at a stage partway through completion. The interconnect region 206 may be formed as a series of dielectric layers to form a dielectric layer stack 222, with interconnect elements formed in each of the dielectric layers. A pre-metal dielectric (PMD) layer of the dielectric layer stack 222 may be formed directly over the substrate 202, and contacts 216 may be subsequently formed through the PMD layer to make electrical connections to the components, including the heat-generating components 208 and the thermally sensitive components 212. A first intra-metal dielectric (IMD) layer is formed as part of the dielectric layer stack 222. Interconnects 218 in a first interconnect level in the first IMD layer are formed over the PMD layer and the contacts 216. The interconnects 218 in the first interconnect level make electrical connections to the contacts 216. A portion of a first inter-level dielectric (ILD) layer may be formed over the first IMD layer and first interconnect level, as part of the dielectric layer stack 222.

Forming the thermal routing structure of the instant example begins with forming a nanoparticle ink film 238 of a nanoparticle ink 240 by an additive process 242 over an instant top surface of the interconnect region 206. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. The nanoparticle ink 240 includes the nanoparticles and a carrier fluid. The nanoparticle ink 240 may be, for example, an ink, a slurry, or a sol gel. The nanoparticles may include materials described for the nanoparticles 133 in reference to FIG. 1A and FIG. 1B. There may be inorganic functional molecules, for example molecules including silicon and oxygen, on surfaces of the nanoparticles. A composition of the nanoparticle ink 240 may be selected to provide a desired adhesion to the integrated circuit 200. The nanoparticle ink 240 is dispensed onto the integrated circuit 200 in an area for the subsequently-formed thermal routing structure, and is not dispensed over the entire instant top surface of the interconnect region 206. One or more layers of a dielectric isolation layer may optionally be formed on the instant top surface prior to forming the nanoparticle ink film 238. The additive process 242 may include, for example, a discrete droplet process, sometimes referred to as an inkjet process, using a discrete droplet dispensing apparatus 243. The discrete droplet dispensing apparatus 243 may be configured so that the integrated circuit 200 and the discrete droplet dispensing apparatus 243 may be moved laterally with respect to each other to provide a desired dispensing pattern for the nanoparticle ink film 238. The discrete droplet dispensing apparatus 243 may have a plurality of dispensing ports which may be independently activated in parallel to provide a desired throughput for the additive process 242. In an alternate version of the instant example, the additive process 242 may include a continuous extrusion process, a direct laser transfer process, an electrostatic deposition process, or an electrochemical deposition process.

In a version of the instant example in which the thermal routing structure is formed at a higher position in the interconnect region 206, vias may be formed in the first ILD, making electrical connections to the interconnects 218 in the first interconnect level. Additional IMD layers with interconnects in sequential interconnect levels, and additional ILD layers with vias, may be formed in the interconnect region 206, before formation of the thermal routing structure.

Figure 2B:
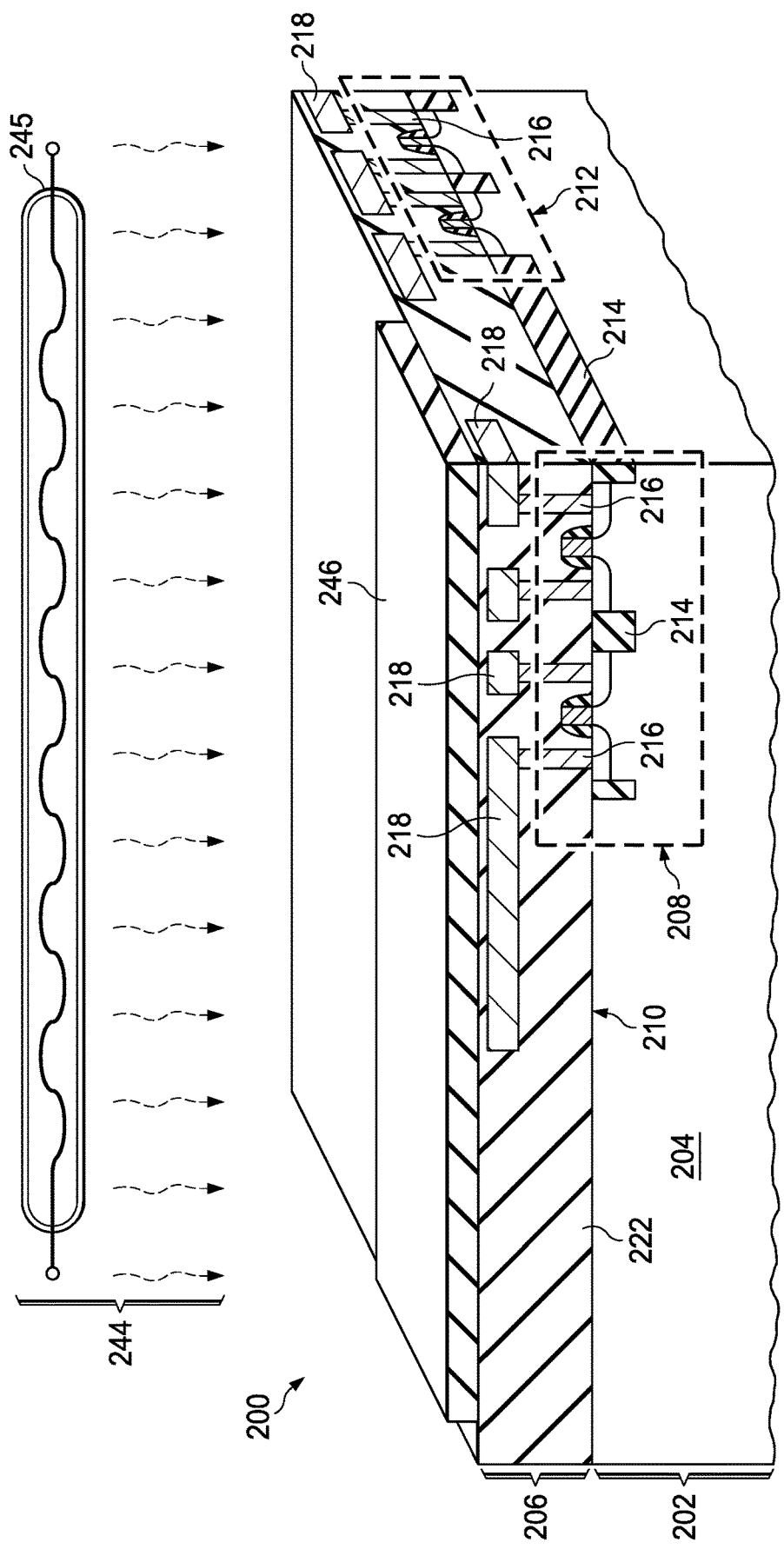

Referring to FIG. 2B, the nanoparticle ink film 238 of FIG. 2A is heated by a bake process 244 to remove at least a portion of a volatile material from the nanoparticle ink film 238 to form a nanoparticle film 246 which includes primarily nanoparticles. The first bake process 244 may be a radiant heat process, using, for example, an incandescent light source 245 as indicated schematically in FIG. 2B, or infrared light emitting diodes (IR LEDs). Alternatively, the bake process 244 may be a hot plate process which heats the nanoparticle ink film 238 through the substrate 202. The bake process 244 may be performed in a partial vacuum, or in an ambient with a continuous flow of gas at low pressure, to enhance removal of the volatile material.

Figure 2C:
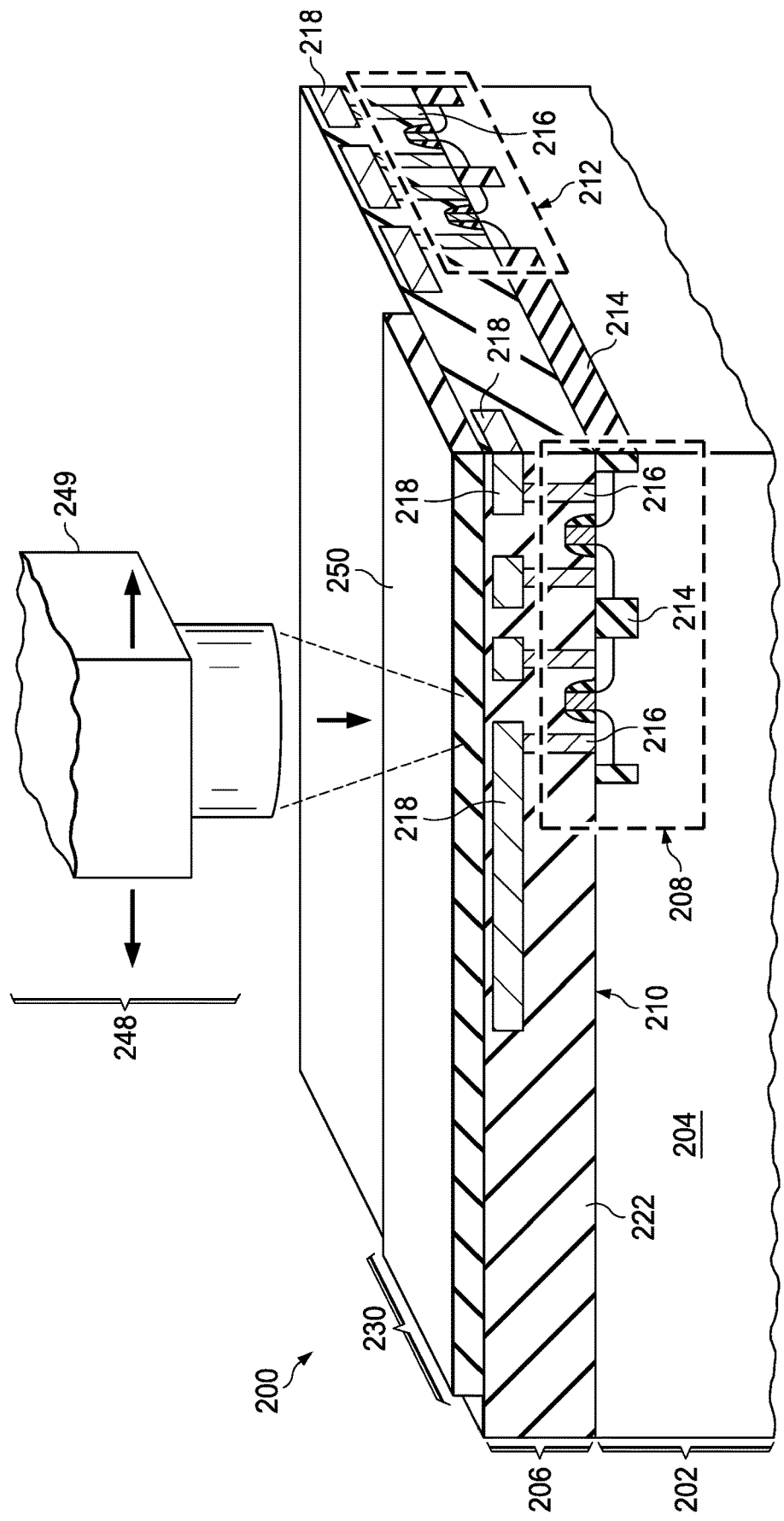

Referring to FIG. 2C, the nanoparticle film 246 of FIG. 2B is heated by a cohesion inducing process 248 so that adjacent nanoparticles cohere to each other, to form a cohered nanoparticle film 250. The temperature required for the nanoparticles to cohere to each other is a function of the size of the nanoparticles. Smaller nanoparticles may be heated at lower temperatures than larger nanoparticles to attain a desired cohesion of the nanoparticles. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms between the adjacent nanoparticles. The cohesion inducing process 248 may include heating by a scanning laser apparatus 249 as depicted schematically in FIG. 2C. The scanning laser apparatus 249 may be configured to provide heat to substantially only the nanoparticle film 246 and not provide heat to portions of the integrated circuit 200 laterally adjacent to the nanoparticle film 246, advantageously reducing a total heat load on the components 208 and 212.

In one variation of the instant example, the cohesion inducing process 248 may include a flash heating process, which applies radiant energy for 1 microsecond to 10 microseconds. In another variation, the cohesion inducing process 248 may include a spike heating process, which applies radiant energy for 100 milliseconds to 5 seconds. In an alternate version of the instant example, the bake process 244 described in reference to FIG. 2B may be combined with the cohesion inducing process 248, wherein thermal power applied to the nanoparticle film 246 of FIG. 2B is ramped to first remove the volatile material, followed by inducing cohesion of the nanoparticles. Other methods of inducing cohesion between the nanoparticles are within the scope of the instant example.

The cohered nanoparticle film 250 may provide the thermal routing structure 230. Alternatively, the steps disclosed in reference to FIG. 2A through FIG. 2C may be repeated to form a second cohered nanoparticle film, that in combination with the cohered nanoparticle film 250, provides the thermal routing structure 230 with a desired thickness. Some parameters of the process steps, such as bake time and temperature, may be adjusted to accommodate more than one cohered nanoparticle film in the thermal routing structure 230.

Figure 2D:
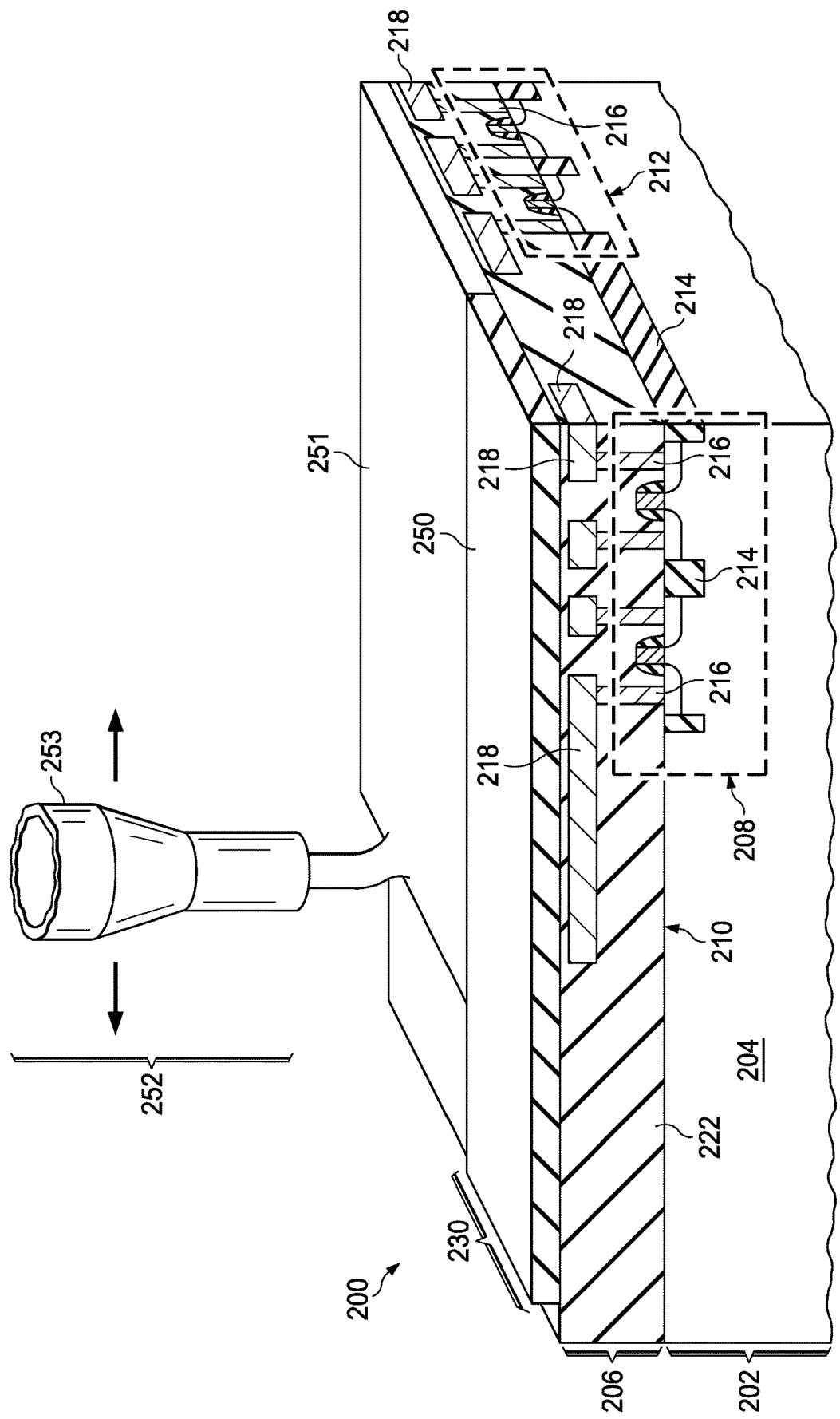

Referring to FIG. 2D, a planarization layer, similar to the planarization layer 136 described in reference to FIG. 1A, may optionally be formed that is laterally adjacent to the thermal routing structure 230, to provide a substantially level surface which facilitates formation of subsequent layers of the interconnect region 206. The planarization layer may be formed by any of various methods; the instant example discloses forming the planarization layer using an additive process. Formation of the planarization layer begins with forming a slurry layer 251 by an additive process 252 on the instant top surface of the interconnect region 206 laterally adjacent to the thermal routing structure 230. The slurry layer 251 may include dielectric grains dispersed in an aqueous fluid or possibly an organic binder precursor fluid. The additive process 252 may use a continuous dispensing apparatus 253 as depicted schematically in FIG. 2D, or may use another additive apparatus such as a discrete droplet dispenser. The slurry layer 251 may be dispensed onto substantially all of the instant top surface of the interconnect region 206 that is not covered by the thermal routing structure 230.

Figure 2E:
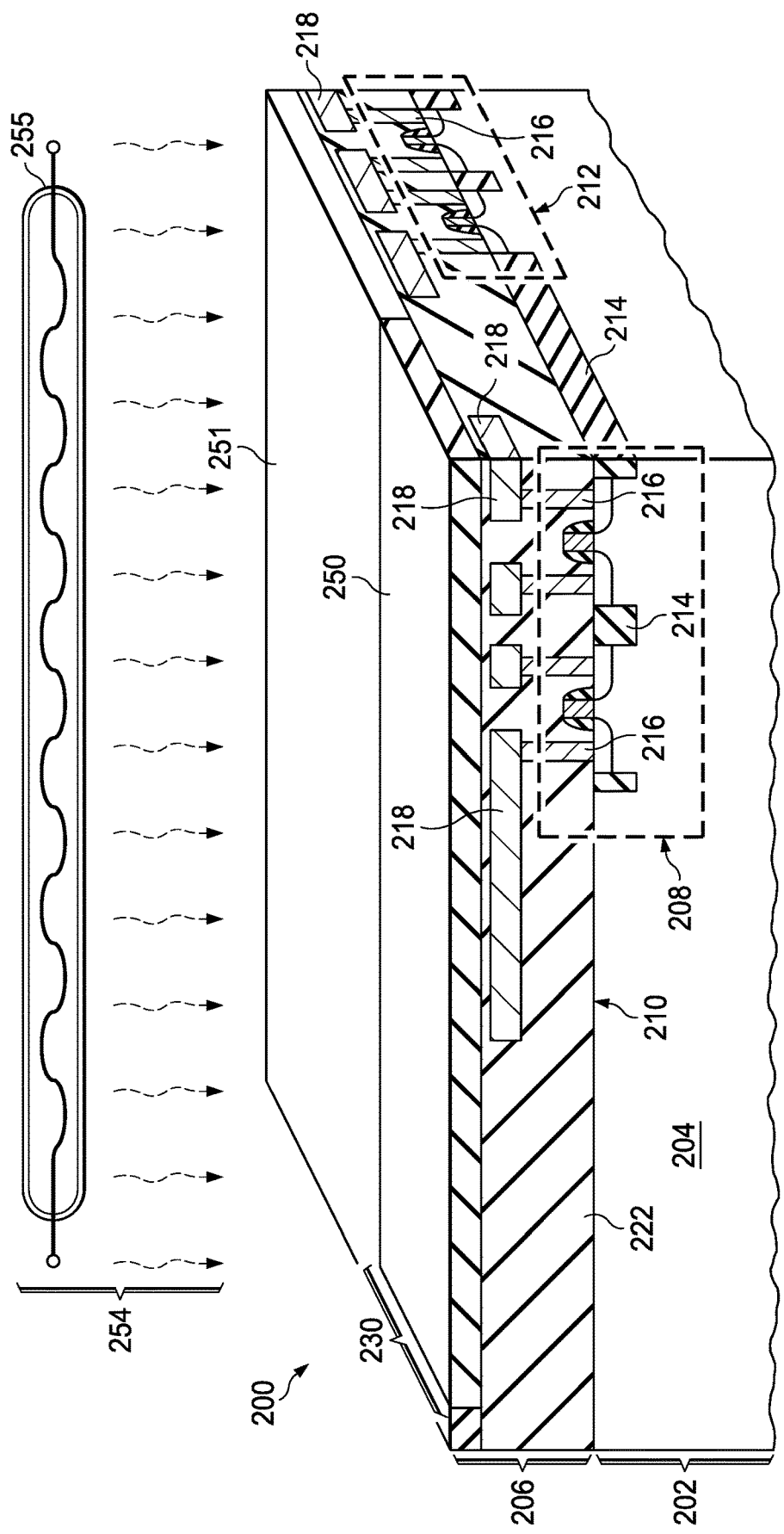

Referring to FIG. 2E, the slurry layer 251 is heated by a slurry bake process 254 to remove at least a portion of a volatile material from the slurry layer 251. The slurry bake process 254 may be a radiant heat process using an incandescent source 255, as indicated in FIG. 2E, or may be a hot plate bake process, a forced air bake process, or a combination thereof.

Figure 2F:
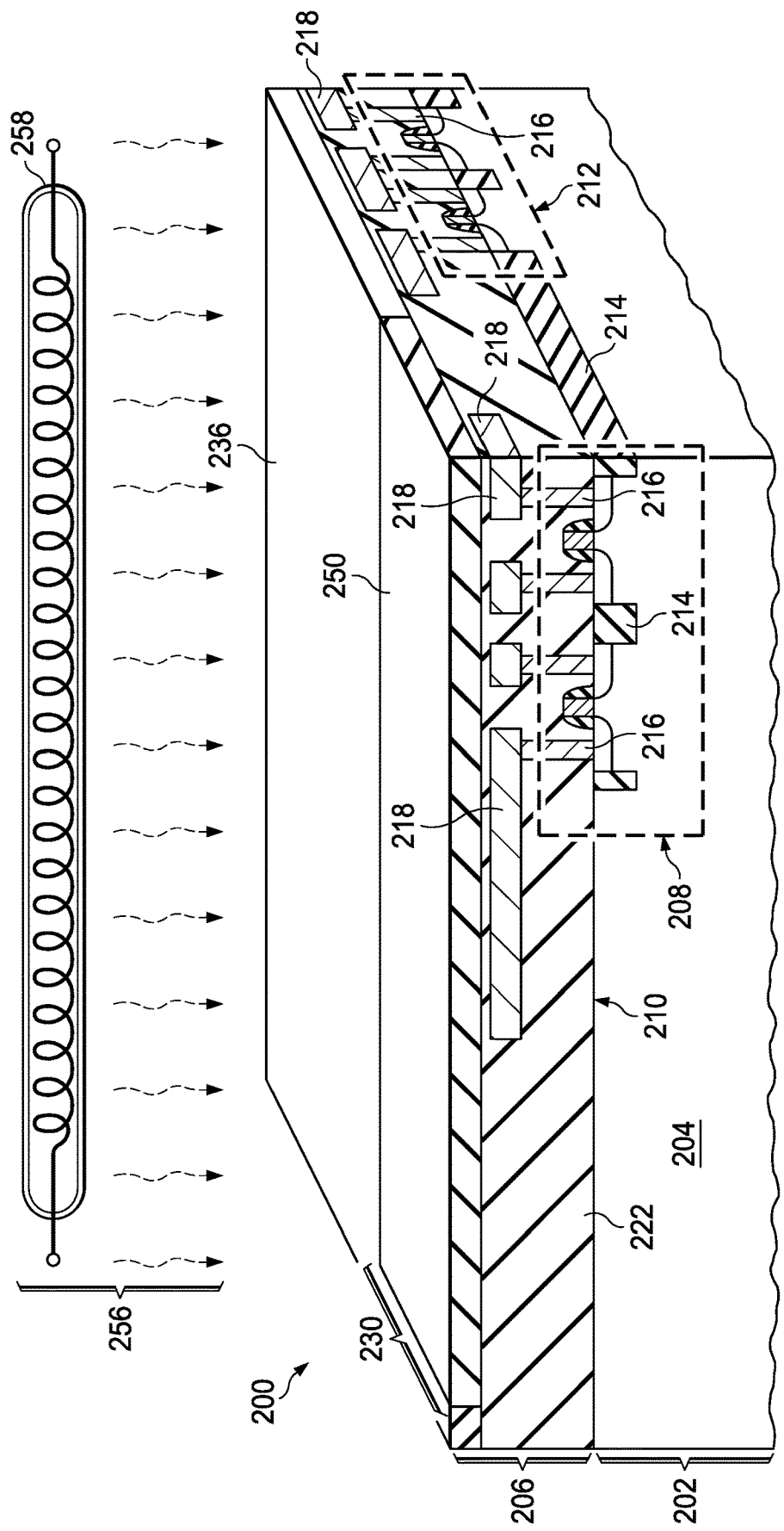

Referring to FIG. 2F, the slurry layer 251 of FIG. 2E is cured to form the planarization layer 236. The slurry layer 251 may be cured by a heat process 256 using a heat lamp 258, as indicated in FIG. 2F, or by exposure to ultraviolet radiation to polymerize an organic precursor in the slurry layer 251.

Formation of the interconnect region 206 continues with formation of dielectric layers of the dielectric layer stack 222 and formation of vias. The vias may be formed through the thermal routing structure 230, and through the planarization layer 236 if present, with appropriate adjustments to etch process for forming via holes.

Figure 3A:
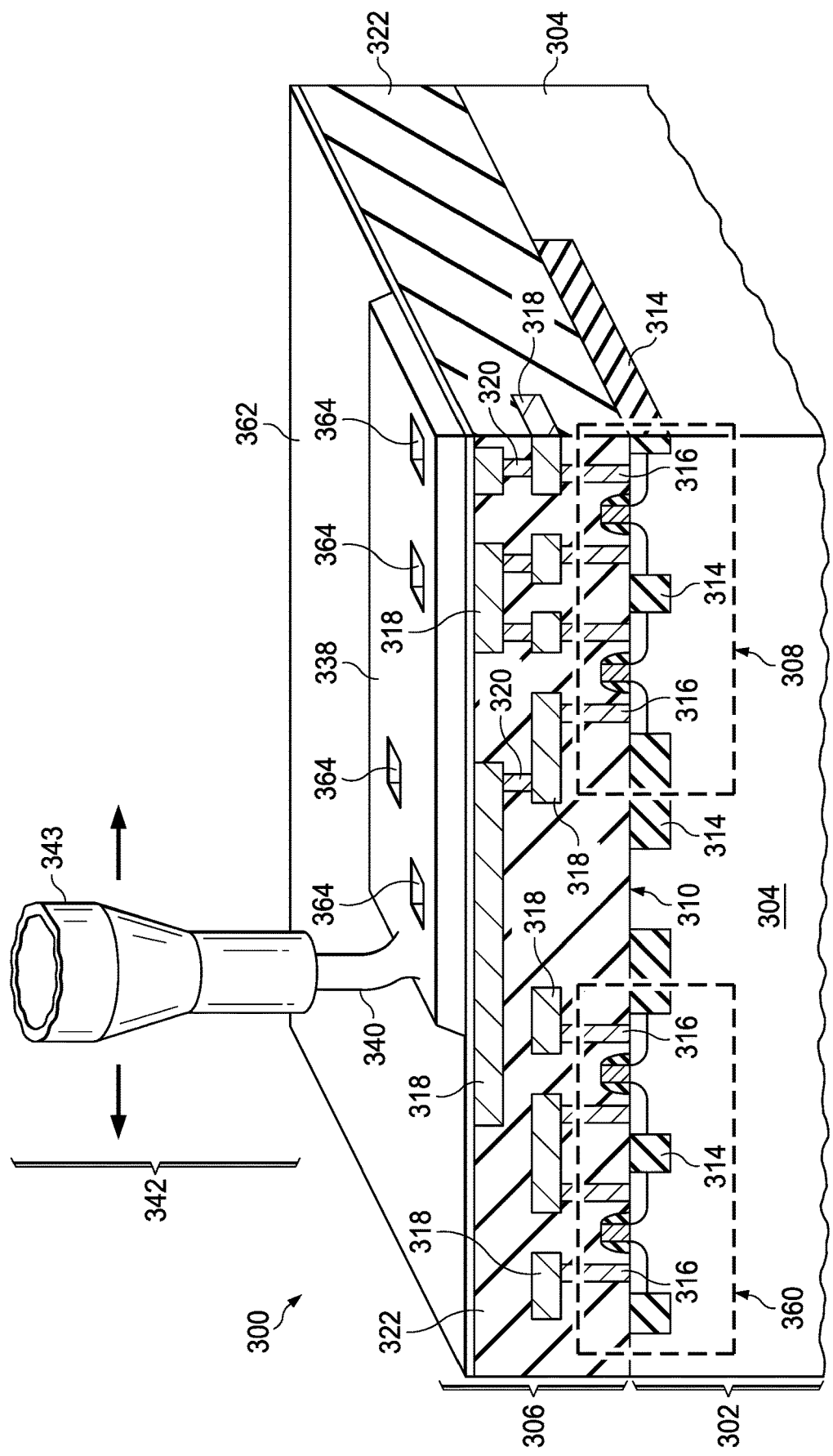
FIG. 3A through FIG. 3C depict another example method of forming an integrated circuit with a thermal routing structure according to an embodiment of the invention.
Figure 3B:
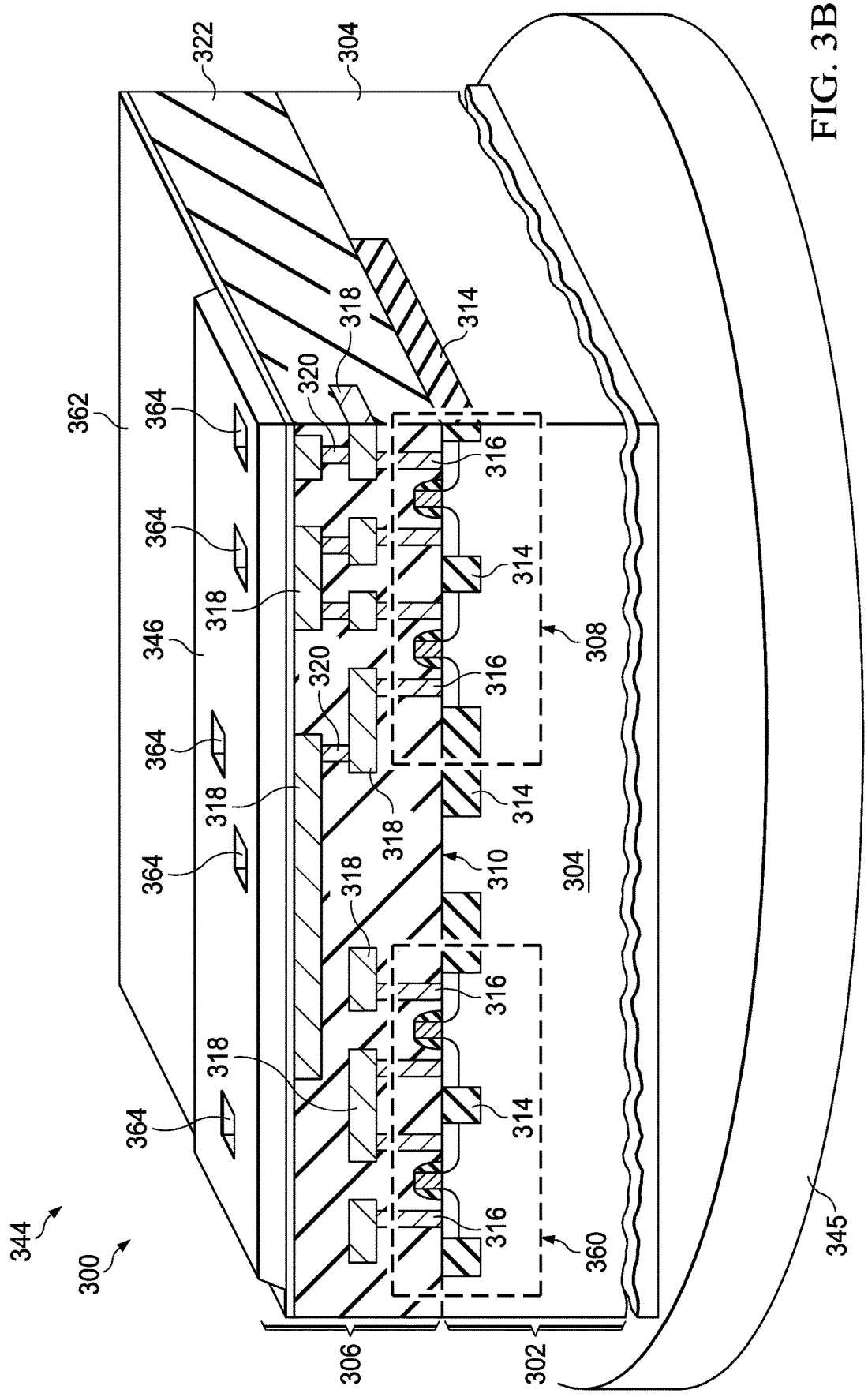
Figure 3C:
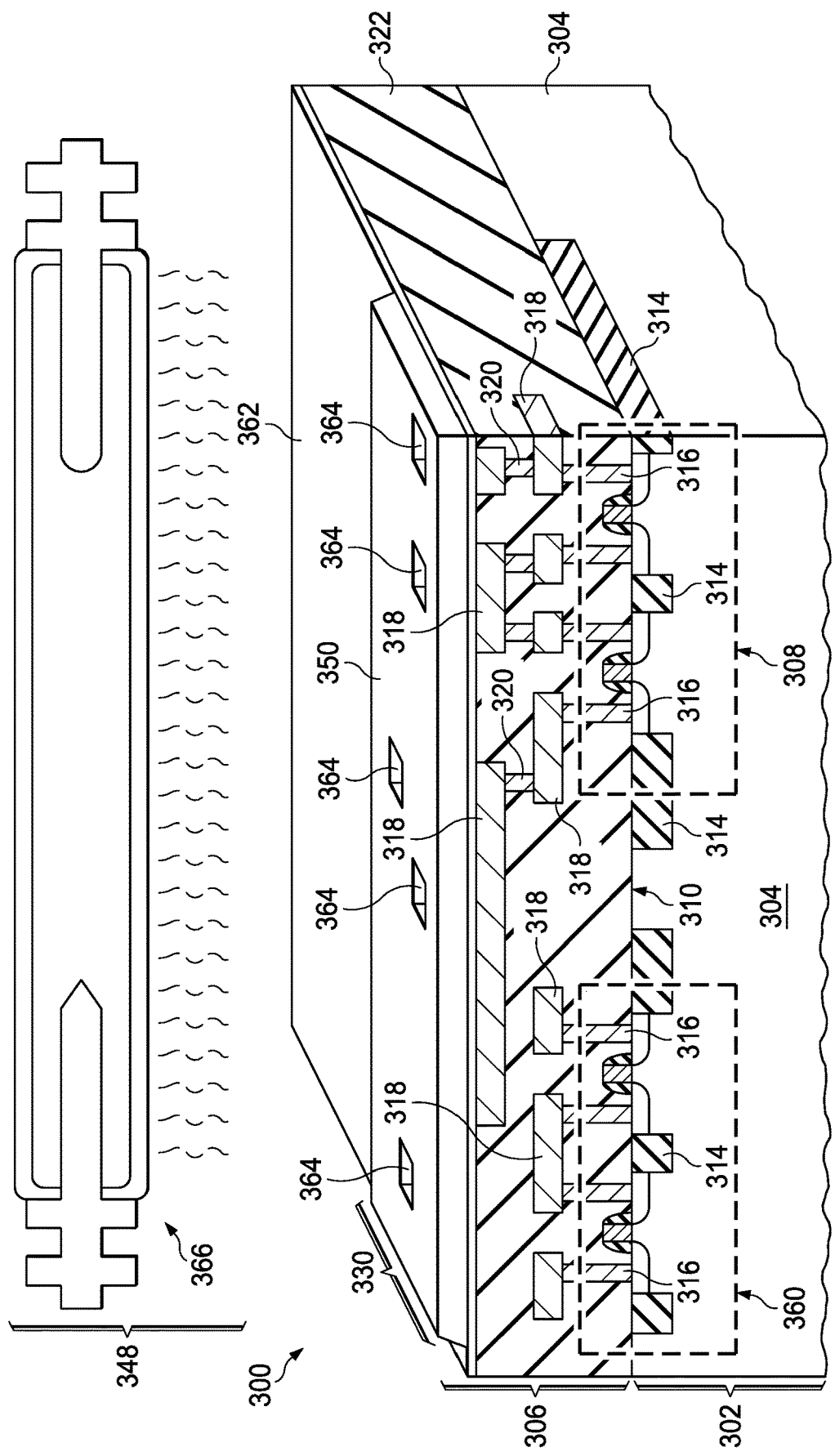

FIG. 3A through FIG. 3C depict another example method of forming an integrated circuit with a thermal routing structure according to an embodiment of the invention. Referring to FIG. 3A, the integrated circuit 300 is formed on a substrate 302 which includes a semiconductor material 304. Components are formed in the semiconductor material 304, proximate to a top surface 310 of the substrate 302. The components of the instant example may include, for example, a first set of components 308 and a second set of components 360, wherein the first set of components 308 is spatially separated from the second set of components 360, and wherein the first set of components 308 and the second set of components 360 benefit from sharing a same thermal environment. The first set of components 308 and the second set of components 360 may be matching components of an analog circuit. Matching components may be understood as components which are designed to have substantially equal performance parameters such as drive current and threshold. Because these performance parameters are affected by temperature, reducing a temperature difference between matching components may advantageously reduce differences in the performance parameters. The components 308 and 360 may include MOS transistors, bipolar junction transistors, JFETs, resistors, SCRs, diodes and/or other components. Field oxide 314 may be formed in the substrate 302 to laterally separate the components. The field oxide 314 may be formed by an STI process or alternatively by a LOCOS process.

An interconnect region 306 is formed over the substrate 302. FIG. 3A shows the interconnect region 306 at a stage partway through completion. The interconnect region 306 may be formed as a series of dielectric layers, such as a PMD layer, and alternating IMD layers and ILD layers, to form a dielectric layer stack 322, with interconnect elements such as contacts 316, interconnects 318, and vias 320 formed in the dielectric layers.

Forming the thermal routing structure of the instant example may begin with optionally forming a dielectric isolation layer 362 over an instant top surface of the interconnect region 306. The dielectric isolation layer 362 may electrically isolate the interconnects 318 from the subsequently formed thermal routing structure. The dielectric isolation layer 362 may include, for example, silicon dioxide-based dielectric material. The dielectric isolation layer 362 may be formed by a plasma enhanced chemical vapor deposition (PECVD) process using tetraethyl orthosilicate (TEOS), or spin coating the integrated circuit 300 with hydrogen silsesquioxane (HSQ) or methyl silsesquioxane (MSQ) followed by baking and annealing. The dielectric isolation layer 362 may be configured as a blanket layer or may be patterned. In one version of the instant example, a patterned manifestation of the dielectric isolation layer 362 may be formed of electrically non-conductive nanoparticles having a high thermal conductivity, which may advantageously increase an overall thermal conductivity of the thermal routing structure. In an alternate version of the instant example, in which no interconnects 318 are exposed at the instant top surface of the interconnect region, forming the dielectric isolation layer may be omitted.

A nanoparticle ink film 338 of a nanoparticle ink 340 is formed on an instant top surface of the interconnect region 306. The nanoparticle ink film 338 is formed by an additive process 342. In the instant example, the nanoparticle ink 340 may include electrically conductive nanoparticles and a carrier fluid. The nanoparticle ink 340 is dispensed onto the integrated circuit 300 in an area for the subsequently-formed thermal routing structure, and is not dispensed over the entire instant top surface of the interconnect region 306. The nanoparticle ink 340 may be omitted outside of areas for subsequently formed vias, so as to leave via openings 364 in the nanoparticle ink film 338, to avoid the electrically conductive nanoparticles touching the subsequently formed vias. The additive process 342 may use a continuous micro-extrusion dispensing apparatus 343, as indicted schematically in FIG. 3A. The continuous micro-extrusion dispensing apparatus 343 may be configured so that the integrated circuit 300 and the continuous micro-extrusion dispensing apparatus 343 may be moved laterally with respect to each other to provide a desired dispensing pattern for the nanoparticle ink film 338.

Referring to FIG. 3B, the nanoparticle ink film 338 of FIG. 3A is heated by a bake process 344 to remove at least a portion of a volatile material from the nanoparticle ink film 338 to form a nanoparticle film 346 which includes primarily nanoparticles. The bake process 344 may be a hot plate process using a hot plate 345 disposed under the substrate 302, as depicted in FIG. 3B. Alternatively, the bake process 344 may be a radiant heat process, as described in reference to FIG. 2B. The bake process 344 may be performed in a partial vacuum, or in an ambient with a continuous flow of gas at low pressure, to enhance removal of the volatile material.

Referring to FIG. 3C, the nanoparticle film 346 of FIG. 3B is heated by a cohesion inducing process 348 so that adjacent nanoparticles cohere to each other, to form a cohered nanoparticle film 350. The cohesion inducing process 348 may include a flash heating process using a flash lamp 366, as depicted schematically in FIG. 3C. Other methods of inducing cohesion between the nanoparticles are within the scope of the instant example. The cohered nanoparticle film 350 may provide substantially all of the thermal routing structure 330. Alternatively, additional cohered nanoparticle films may be formed to combine with the cohered nanoparticle film 350 to provide the thermal routing structure 330.

Figure 4B:
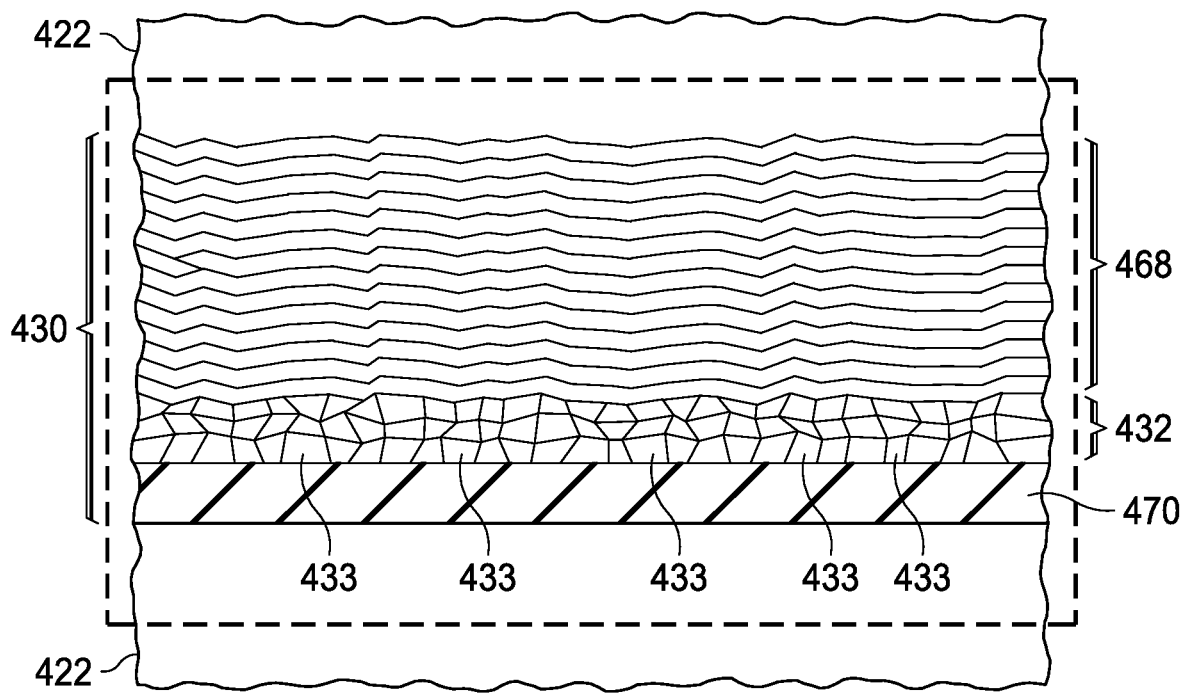
FIG. 4A and FIG. 4B are cross sections of another example integrated circuit containing another thermal routing structure according to an embodiment of the invention.
Figure 4A:
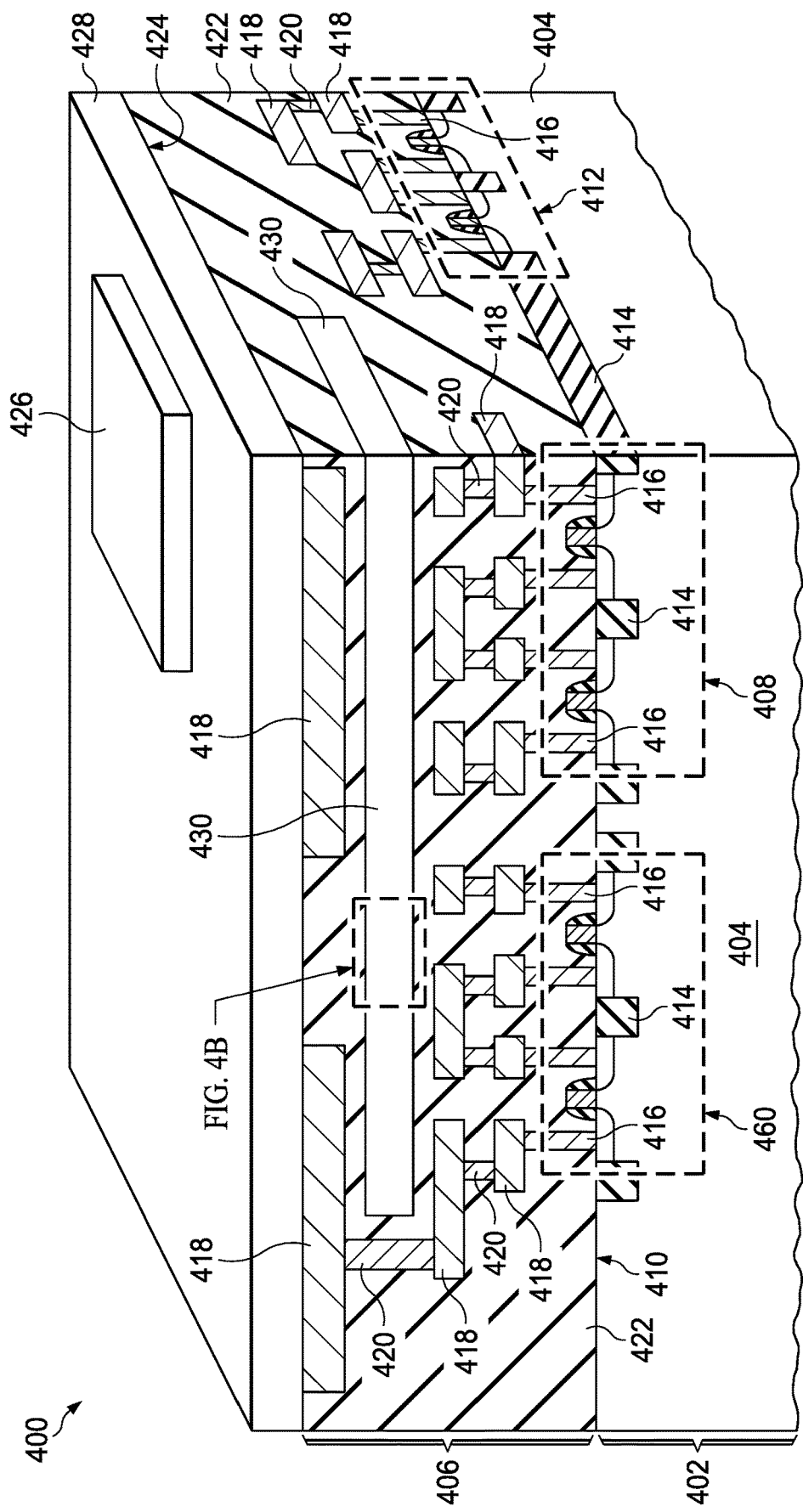

FIG. 4A and FIG. 4B are cross sections of another example integrated circuit containing a thermal routing structure according to an embodiment of the invention. Referring to FIG. 4A, the integrated circuit 400 includes a substrate 402 including a semiconductor material 404. The integrated circuit 400 further includes an interconnect region 406 disposed above the substrate 402. In the instant example, a first set of components 408 and a second set of components 460 are disposed in the substrate 402 and the interconnect region 406, proximate to a boundary 410 between the substrate 402 and the interconnect region 406. In the instant example, the first set of components 408 and the second set of components 460 may be matching components whose performance benefits from having similar thermal environments. The integrated circuit 400 may further include thermally sensitive components 412 whose performance improves as a temperature decreases. The components 408, 460 and 412 are depicted in FIG. 4A as MOS transistors, however other manifestations, such as bipolar junction transistors, JFETs, resistors, and SCRs are within the scope of the instant example. The components 408, 460 and 412 may be laterally separated by field oxide 414 at the boundary 410 between the substrate 402 and the interconnect region 406.

The interconnect region 406 may include contacts 416, interconnects 418 and vias 420 disposed in a dielectric layer stack 422. A top surface 424 of the interconnect region 406 is located at a surface of the interconnect region 406 opposite to the boundary 410 between the substrate 402 and the interconnect region 406. Bond pad structures 426 may be disposed over the top surface 424 of the interconnect region 406, and are electrically coupled to the interconnects 418. A protective overcoat 428 may be disposed over the top surface 424 of the interconnect region 406. The bond pad structures 426 may extend through the protective overcoat 428.

A thermal routing structure 430 is disposed in the interconnect region 406, extending over a portion, but not all, of the integrated circuit 400 in the interconnect region 406. In the instant example, the thermal routing structure 430 includes a cohered nanoparticle film 432 including nanoparticles 433 which include metal, and a layer of graphitic material 468 disposed on the cohered nanoparticle film 432, shown in detail in FIG. 4B. The nanoparticles 433 may include, for example, copper, nickel, palladium, platinum, iridium, rhodium, cerium, osmium, molybdenum, and/or gold. The layer of graphitic material 468 may include graphite, graphitic carbon, graphene, carbon nanotubes or the like.

A dielectric isolation layer 470 may optionally be disposed under the thermal routing structure 430. The dielectric isolation layer 470 may electrically isolate the layer of cohered nanoparticle film 432 from underlying interconnects 418. In the instant example, the thermal routing structure 430 may extend over the first set of components 408 and the second set of components 460, and may extend away the thermally sensitive components 412, as shown in FIG. 4A. Thus, the thermal routing structure 430 may provide a more closely matched thermal environment for the first set of components 408 and the second set of components 460 and thereby improve their performance, while advantageously diverting heat from the first set of components 408 and the second set of components 460 away from the thermally sensitive components 412.

Figure 5A:
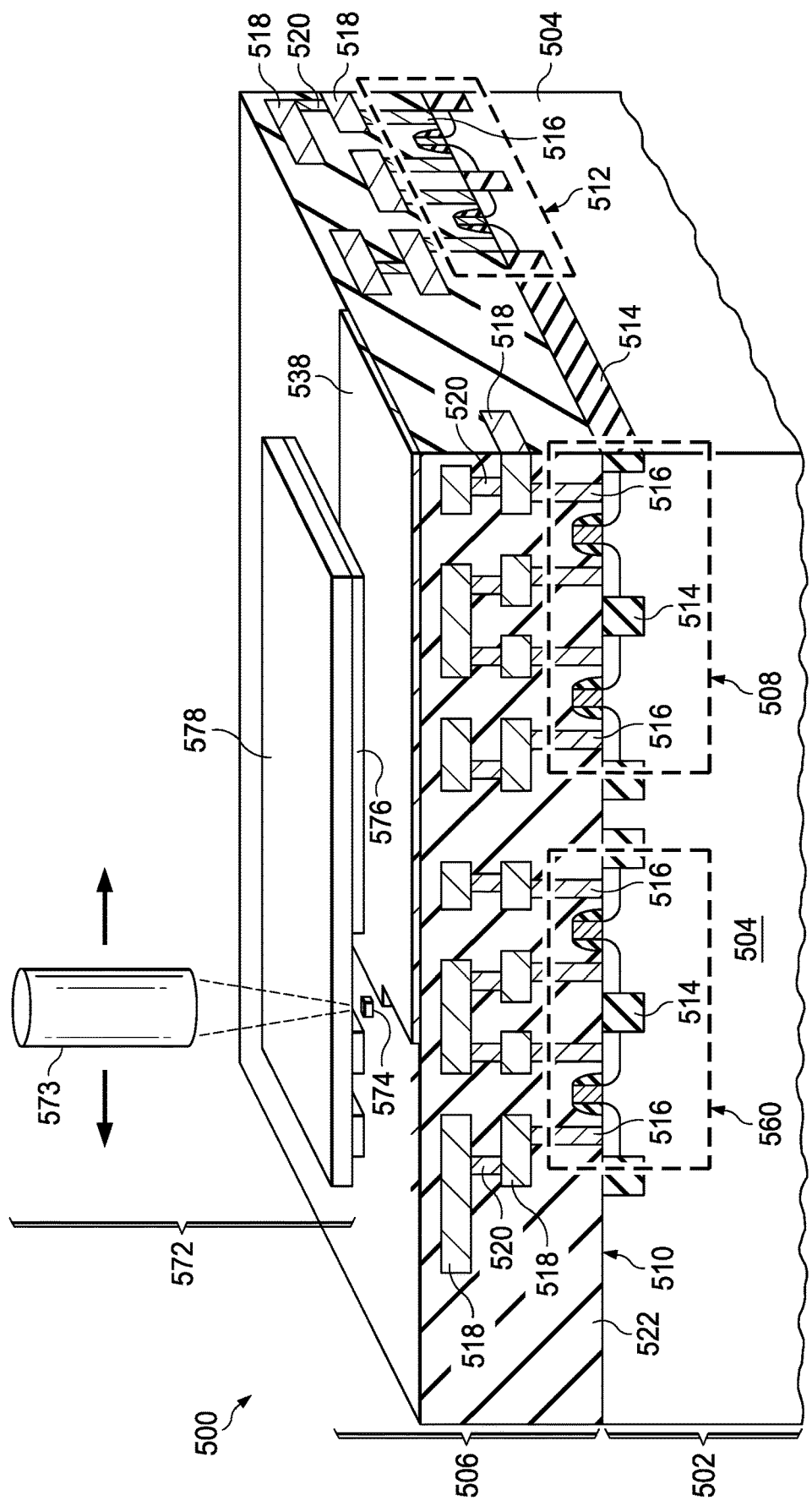
FIG. 5A through FIG. 5D depict an example method of forming an integrated circuit with a thermal routing structure of the type described in reference to FIG. 4A and FIG. 4B according to an embodiment of the invention.

FIG. 5A through FIG. 5D depict another example method of forming an integrated circuit with a thermal routing structure according to an embodiment of the invention. Referring to FIG. 5A, the integrated circuit 500 is formed on a substrate 502 which includes a semiconductor material 504. Components including, for example, heat-generating components 508, thermally sensitive components 512 and matching components 560, are formed in the semiconductor material 504 proximate to a top surface 510 of the substrate 502. The top surface 510 of the substrate 502 is also a boundary between the substrate 502 and the interconnect region 506. Field oxide 514 may be formed in the substrate 502 to laterally separate the components 508, 512 and 560. An interconnect region 506 is formed over the substrate 502. The interconnect region 506 may be formed to have a dielectric layer stack 522, with interconnect elements such as contacts 516, interconnects 518, and vias 520 formed in the dielectric layer stack 522.

A dielectric isolation layer, not shown in FIG. 5A, may optionally be formed in an area for the thermal routing structure. The dielectric isolation layer may be formed by any of various methods, for example as described in reference to the dielectric isolation layer 362 of FIG. 3A. A nanoparticle ink film 538 containing nanoparticles which include metal is formed by an additive process 572 over an instant top surface of the interconnect region 506, on the dielectric isolation layer, if present. The nanoparticles may include the metals disclosed in reference to FIG. 4A and FIG. 4B, or other metal suitable as a catalyst for subsequent growth of graphitic material. The nanoparticle ink film 538 is formed in an area for the subsequently-formed thermal routing structure, and is not formed over an entire instant top surface of the interconnect region 506. The additive process 572 may include a direct laser transfer process which uses a pulsed laser 573 to transfer small pieces of nanoparticle ink 574 of a source layer 576 containing the nanoparticles to the integrated circuit 500, as depicted in FIG. 5A. The source layer 576 is attached to a backing layer 578. The combined source layer 576 and backing layer 578 are sometimes referred to as a ribbon. The pulsed laser 573, the source layer 576 and backing layer 578, and the integrated circuit 500 may be moved relative to each other to form the nanoparticle ink film 538 in a desired area. Other methods of forming the nanoparticle ink film 538 are within the scope of the instant example.

Figure 5B:
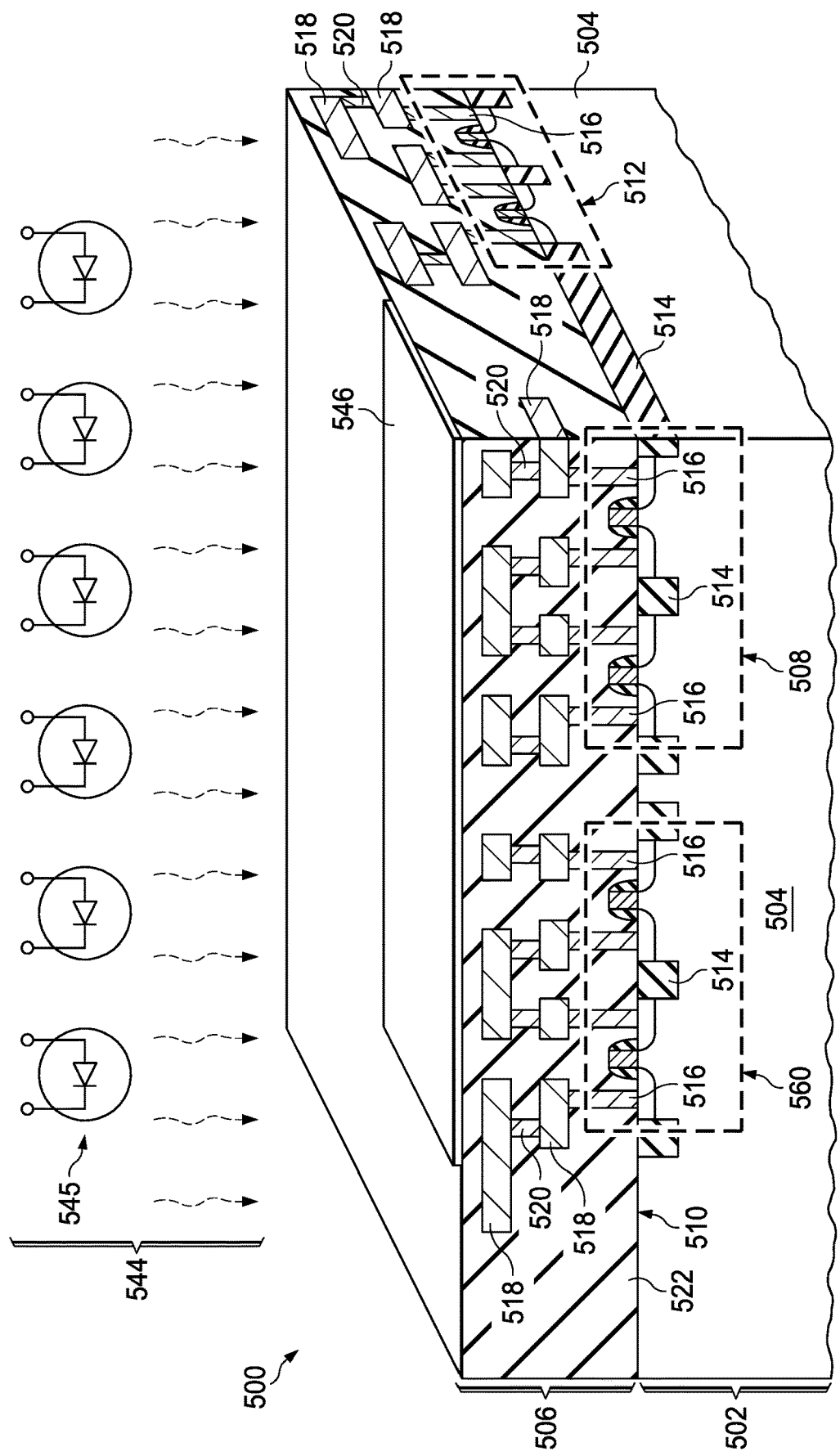

Referring to FIG. 5B, the nanoparticle ink film 538 of FIG. 5A may be heated by a bake process 544 to remove at least a portion of a volatile material from the nanoparticle ink film 538 to form a nanoparticle film 546 which includes primarily nanoparticles. The bake process 544 may be a radiant heat process using IR LEDs 545 as depicted schematically in FIG. 5B. Using the IR LEDs 545 may enable application of the radiant heat to substantially only an area containing the nanoparticle ink film 538 while not applying the radiant heat to areas of the integrated circuit 500 outside of the nanoparticle ink film 538, advantageously reducing a heat load on the components 508, 512, and 568. Alternatively, the bake process 544 may include a radiant heat process using an incandescent source, or may include a hot plate process.

Figure 5C:
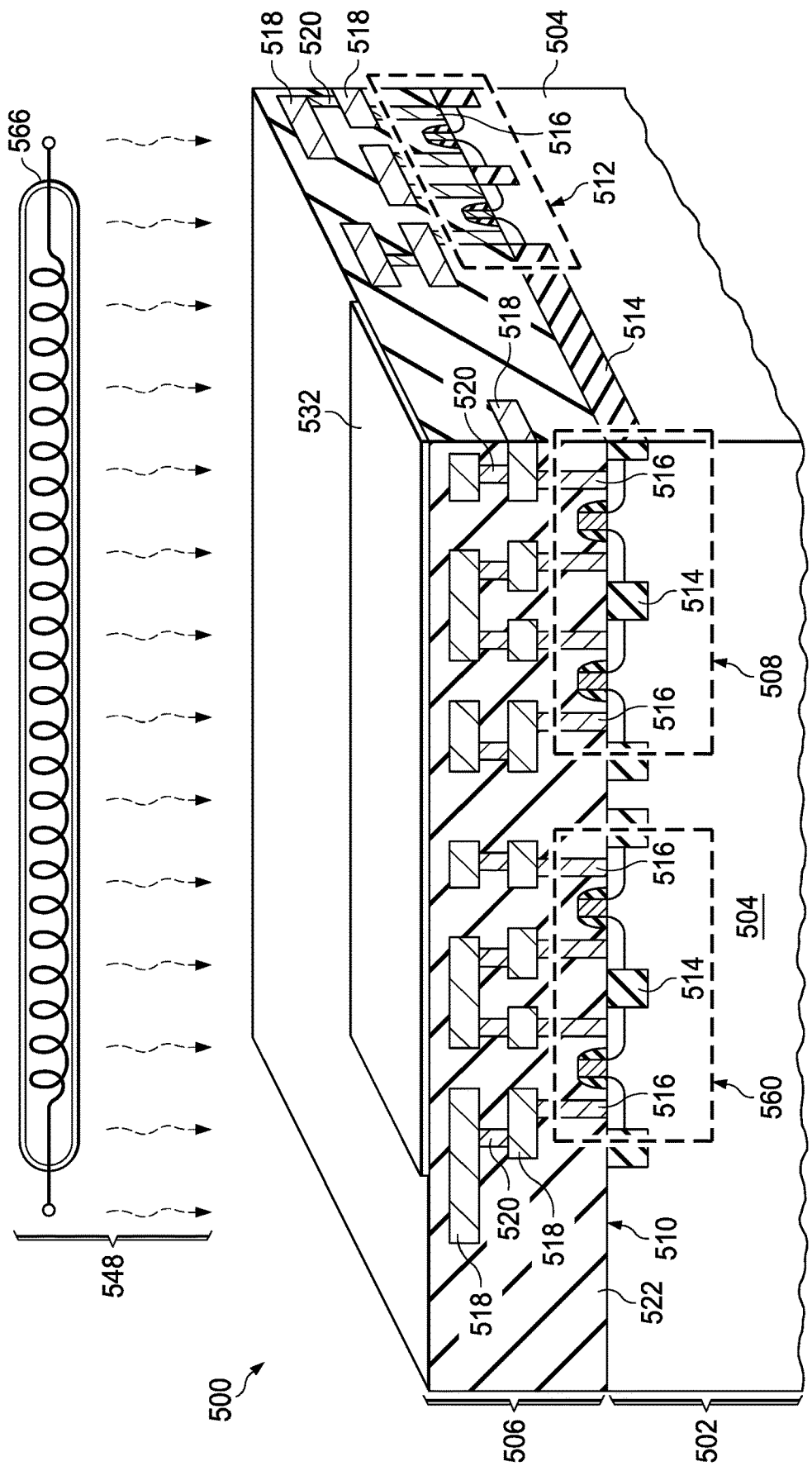

Referring to FIG. 5C, the nanoparticle film 546 of FIG. 5B is heated by a cohesion inducing process 548 so that adjacent nanoparticles cohere to each other, to form a cohered nanoparticle film 532. The cohesion inducing process 548 may include a spike heating process using an incandescent lamp 566, as depicted schematically in FIG. 5C. The spike heating process heats the nanoparticle film 546 for a time duration of, for example, 1 millisecond to 10 milliseconds, to advantageously limit heating of the components 508, 512 and 568. Other methods of inducing cohesion between the nanoparticles are within the scope of the instant example.

Figure 5D:
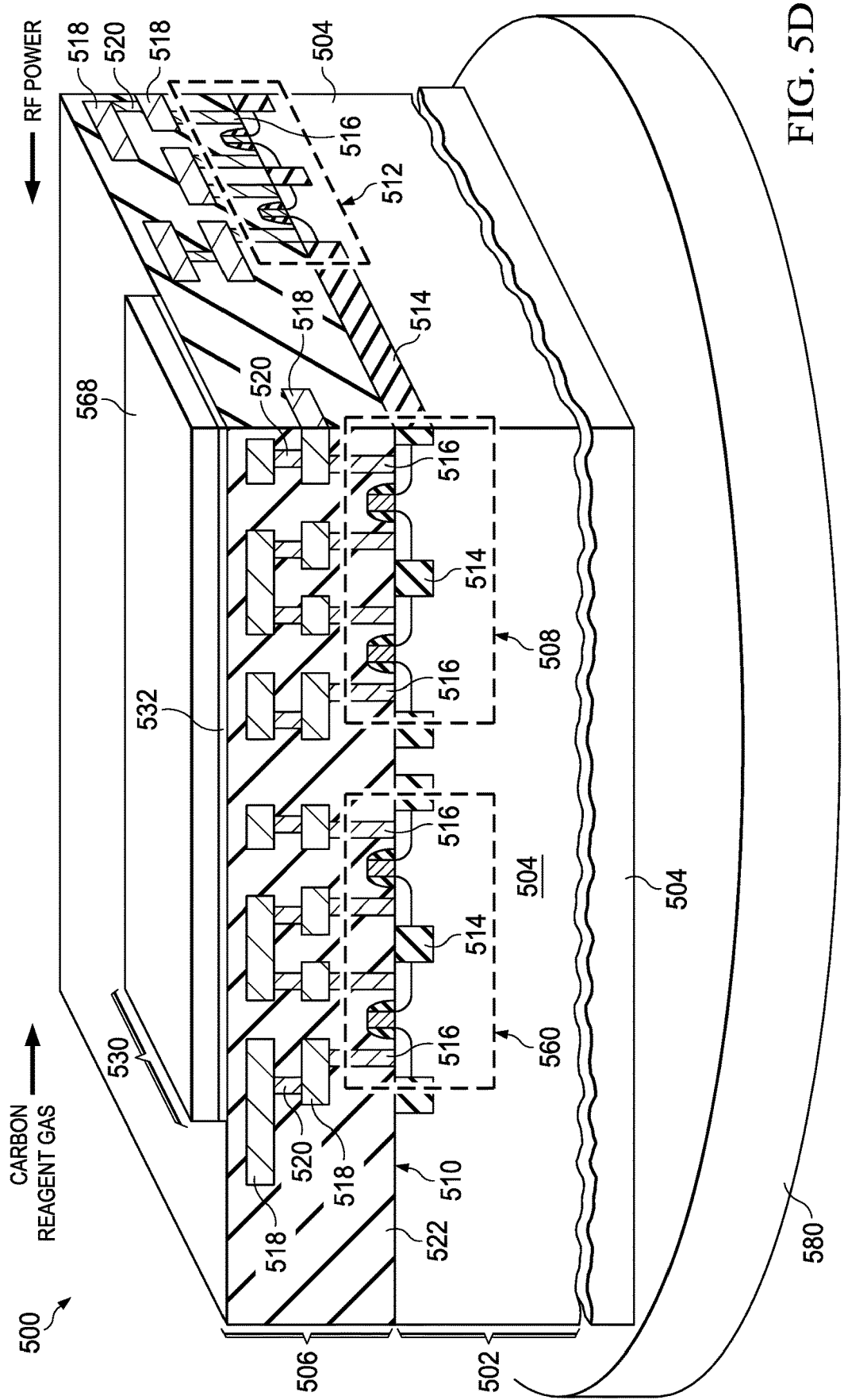

Referring to FIG. 5D, a layer of graphitic material 568 is selectively formed on the cohered nanoparticle film 532 by a graphitic material PECVD process. In the graphitic material PECVD process, the substrate 502 is disposed on a wafer chuck 580 and is heated by the wafer chuck 580, for example to a temperature of 200° C. to 400° C. A carbon-containing reagent gas, denoted in FIG. 5D as "CARBON REAGENT GAS" is flowed over the integrated circuit 500 and radio frequency (RF) power, denoted in FIG. 5D as "RF POWER" is applied to the carbon-containing reagent gas to generate carbon radicals above the integrated circuit 500. The carbon-containing reagent gas may include methane, straight chain alkanes such as ethane, propane and/or butane, alcohols such as ethanol, and/or cyclic hydrocarbons such as cyclobutane or benzene. Additional gases, such as hydrogen, argon and/or oxygen, may be flowed over the the integrated circuit 500. The nanoparticles in the cohered nanoparticle film 532 catalyze the carbon radicals to react to form the graphitic material 568, so that a first layer of the layer of graphitic material 568 is formed selectively on the cohered nanoparticle film 532. Subsequent layers of the graphitic material 568 are formed selectively on the previously formed layers of graphitic material 568, so that the layer of graphitic material 568 is formed selectively on the cohered nanoparticle film 532, and the graphitic material 568 is not formed on the integrated circuit 500 outside of the cohered nanoparticle film 532. The combined cohered nanoparticle film 532 and the layer of graphitic material 568 provide the thermal routing structure 530.

Figure 6:
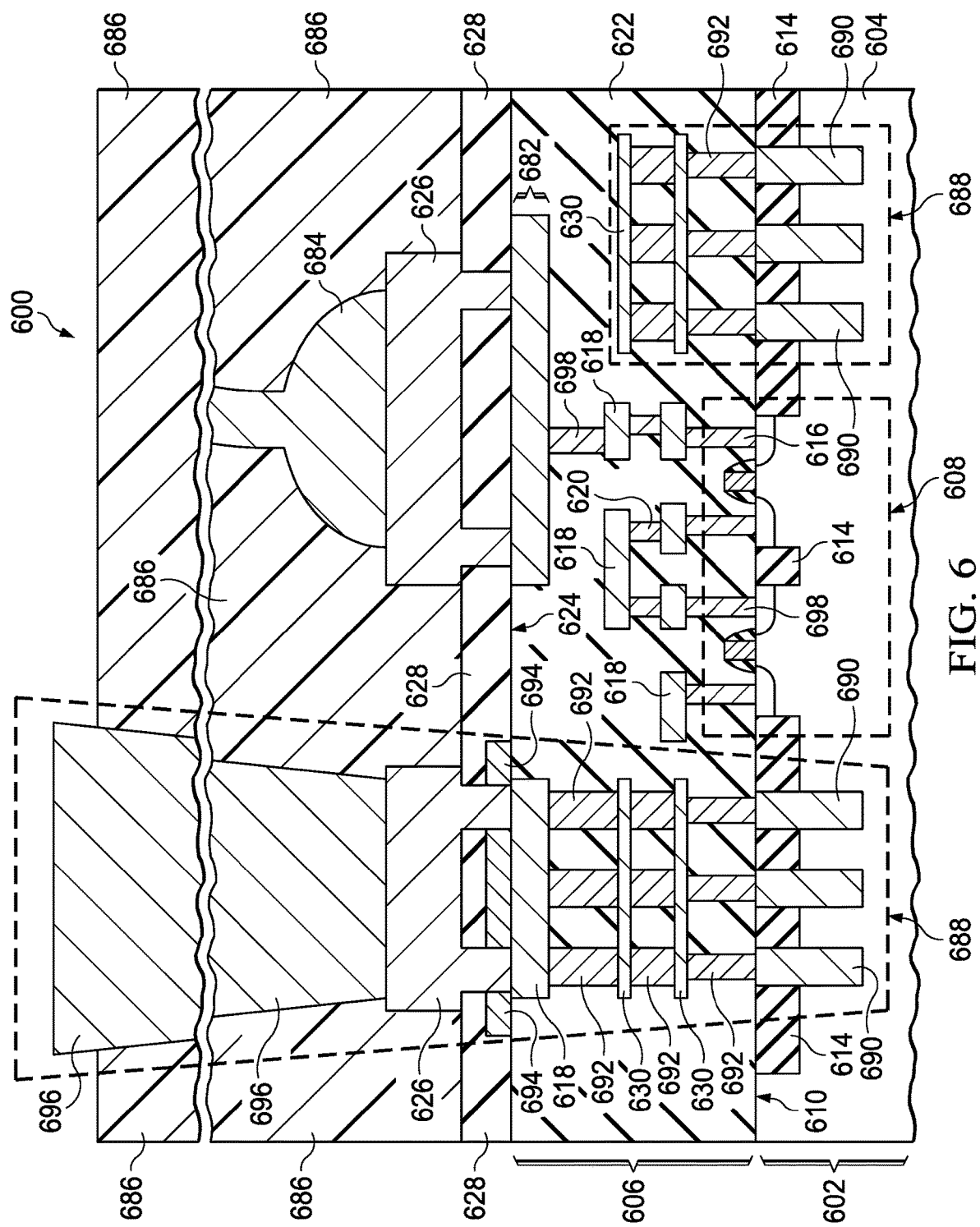
FIG. 6 is a cross section of an example integrated circuit which includes a combined thermal routing structure according to an embodiment of the invention.

FIG. 6 is a cross section of an example integrated circuit which includes a combined thermal routing structure according to an embodiment of the invention. The integrated circuit 600 includes a substrate 602 including a semiconductor material 604. The integrated circuit 600 further includes an interconnect region 606 disposed above the substrate 602. Heat-generating components 608 are disposed in the substrate 602 and the interconnect region 606, proximate to a boundary 610 between the substrate 602 and the interconnect region 606. The components 608 may be, for example, MOS transistors, bipolar junction transistors, JFETs, resistors, and/or SCRs. The components 608 may be laterally separated by field oxide 614 at the boundary 610 between the substrate 602 and the interconnect region 606. The interconnect region 606 may include contacts 616, interconnects 618 and vias 620 disposed in a dielectric layer stack 622. Some of the interconnects 618 are disposed in a top interconnect level 682 which is located proximate to a top surface 624 of the interconnect region 606. The top surface 624 of the interconnect region 606 is located opposite from the boundary 610 between the substrate 602 and the interconnect region 606. Bond pad structures 626 are disposed over the top surface 624 of the interconnect region 606, and are electrically coupled to the interconnects 618 in the top interconnect level 682. A protective overcoat 628 is disposed over the top surface 624 of the interconnect region 606.

In the instant example, the integrated circuit 600 is assembled using wire bonds 684 on some of the bond pad structures 626. The integrated circuit 600 is packaged by encapsulation in an encapsulation material 686. The encapsulation material 686, which may be an epoxy for example, is disposed over the protective overcoat 628 and the bond pad structures 626.

The integrated circuit 600 of the instant example includes the combined thermal routing structure 688, which extends from inside the substrate 602 through the interconnect region 606, and through the organic polymer encapsulation material 686. The combined thermal routing structure 688 includes a thermal routing structure 630 disposed in the interconnect region 606 according to any of the examples herein. The combined thermal routing structure 688 may conduct heat generated by the components 608 to a heat removal apparatus, such as a heat sink, located outside of a package containing the integrated circuit 600, which may advantageously reduce an operating temperature of the components 608.

The combined thermal routing structure 688 may include deep trench thermal routing structures 690 disposed in the substrate 602 and extending to the boundary 610 between the substrate 602 and the interconnect region 606. The deep trench thermal routing structures 690 may surround a portion of the components 608 and may be connected to each other at locations out of the plane of FIG. 6. The deep trench thermal routing structures 690 may have structures and may be formed, for example, as described in the commonly assigned patent application having patent application Ser. No. 15/361,397, filed simultaneously with this application, and which is incorporated herein by reference.

The combined thermal routing structure 688 may include high thermal conductivity vias 692 disposed in the interconnect region 606. The high thermal conductivity vias 692 may surround a portion of the components 608 and may be connected to each other at locations out of the plane of FIG. 6. The high thermal conductivity vias 692 may have structures and may be formed, for example, as described in the commonly assigned patent application having patent application Ser. No. 15/361,399, filed simultaneously with this application, and which is incorporated herein by reference.

The combined thermal routing structure 688 may include a top level thermal conductivity structure 694 disposed above the top interconnect level 682. The top level thermal conductivity structure 694 may have a structure and may be formed, for example, as described in the commonly assigned patent application having patent application Ser. No. 15/361,390, filed simultaneously with this application, and which is incorporated herein by reference.

The combined thermal routing structure 688 may include high thermal conductivity through-package conduits 696 disposed through the encapsulation material 686 to the integrated circuit 600. The high thermal conductivity through-package conduits 696 may have structures and may be formed, for example, as described in the commonly assigned patent application having patent application Ser. No. 15/361,403, filed simultaneously with this application, and which is incorporated herein by reference.

The integrated circuit 600 may further include graphitic material vias 698 which are electrically coupled to the components 608. The graphitic material vias 698 may conduct heat generated by the components 608 away from the substrate, possibly to the combined thermal routing structure 688, which may advantageously reduce an operating temperature of the components 608. The graphitic material vias 698 may have structures and may be formed, for example, as described in the commonly assigned patent application having patent application Ser. No. 15/361,401, filed simultaneously with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a substrate comprising a semiconductor material and a heat-generating component;
    an interconnect region above the substrate, the interconnect region comprising a dielectric layer stack comprising dielectric material and contacts disposed in the dielectric layer stack;
    a thermal routing structure contacting the dielectric material, the thermal routing structure thermally coupled to the heat-generating component, the thermal routing structure includes a cohered nanoparticle film comprising nanoparticles and inorganic molecules, a graphitic material adjacent to a portion of the cohered nanoparticle film, and a thermal conductivity of the thermal routing structure is higher than a thermal conductivity of dielectric material contacting the thermal routing structure; and
    a dielectric isolation layer adjacent to the thermal routing structure, the dielectric isolation layer comprising electrically non-conductive nanoparticles having a high thermal routing structure, and the dielectric isolation layer electrically isolating electricity of the contacts from the thermal routing structure.

2. The integrated circuit of claim 1, wherein the cohered nanoparticle film comprises electrically non-conductive nanoparticles of a material selected from the group consisting of aluminum oxide, diamond, hexagonal boron nitride, cubic boron nitride, and aluminum nitride.

3. The integrated circuit of claim 2, wherein the interconnect region comprises vias electrically coupled to the contacts and at least one of the vias touches the dielectric isolation layer.

4. The integrated circuit of claim 1, wherein the cohered nanoparticle film comprises electrically conductive nanoparticles of a material selected from the group consisting of metal, graphene, graphene embedded in metal, graphite, graphitic carbon, and/or carbon nanotubes.

5. The integrated circuit of claim 1, wherein the cohered nanoparticle film comprises nanoparticles of a metal selected from the group consisting of copper, nickel, palladium, platinum, iridium, rhodium, cerium, osmium, molybdenum, and gold, and wherein the thermal routing structure comprises a layer of graphitic material disposed on the cohered nanoparticle film.

6. The integrated circuit of claim 1, wherein the thermal routing structure extends to a heat removal region of the integrated circuit.

7. The integrated circuit of claim 1, wherein the thermal routing structure extends away from a thermally sensitive component of the integrated circuit.

8. The integrated circuit of claim 1, wherein the thermal routing structure extends over matching components of the integrated circuit.

9. The integrated circuit of claim 1, wherein the dielectric isolation layer is formed over an instant top surface of the interconnect region and beneath the thermal routing structure, so that no interconnects of the interconnect region contact the thermal routing structure.

10. The integrated circuit of claim 1, further comprising a thermal routing component selected from the group consisting of a deep trench thermal routing structure, a high thermal conductivity via, a top level thermal conductivity structure, a high thermal conductivity through-package conduit, and a graphitic via;
    wherein:
        the deep trench thermal routing structure comprises a cohered nanoparticle film, the deep trench thermal routing structure being disposed in the substrate and extending to the boundary between the substrate and the interconnect region;
        the high thermal conductivity via comprises a cohered nanoparticle film, the high thermal conductivity via being disposed above the interconnect region;
        the top level thermal conductivity structure comprises a cohered nanoparticle film, the top level thermal conductivity structure being disposed above the interconnect region;
        the high thermal conductivity through-package conduit comprises a cohered nanoparticle film, the high thermal conductivity through-package conduit being disposed through an encapsulation material over the integrated circuit and extending to the integrated circuit; and
        the graphitic via comprises a cohered nanoparticle film, the graphitic via being electrically coupled to one of a plurality of components of the integrated circuit.

11. The integrated circuit of claim 1, wherein adjacent nanoparticles in the cohered nanoparticle film cohere to each other.

12. The integrated circuit of claim 11, wherein the cohered nanoparticle film is substantially free of an organic binder material.

13. The integrated circuit of claim 1, wherein the thermal routing structure is electrically non-conductive.

* * * * *